(12) United States Patent
Kawaguchi et al.

(10) Patent No.: US 7,423,219 B2
(45) Date of Patent: Sep. 9, 2008

(54) FLEX-RIGID WIRING BOARD

(75) Inventors: Katsuo Kawaguchi, Gifu (JP); Hirofumi Futamura, Gifu (JP); Yukinobu Mikado, Gifu (JP); Sotarou Ito, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 150 days.

(21) Appl. No.: 10/558,289

(22) PCT Filed: May 23, 2005

(86) PCT No.: PCT/JP2005/009819

§ 371 (c)(1),
(2), (4) Date: Nov. 28, 2005

(87) PCT Pub. No.: WO2005/122657

PCT Pub. Date: Dec. 22, 2005

(65) Prior Publication Data
US 2007/0012475 A1    Jan. 18, 2007

(30) Foreign Application Priority Data
Jun. 11, 2004    (JP) .......................... 2004-173414

(51) Int. Cl.
H05K 1/00    (2006.01)
(52) U.S. Cl. ...................... 174/254; 174/260
(58) Field of Classification Search ........... 174/260, 174/254
See application file for complete search history.

(56) References Cited
U.S. PATENT DOCUMENTS

| | | | |
|---|---|---|---|
| 5,084,961 A * | 2/1992 | Yoshikawa | .............. 29/840 |
| 5,428,190 A | 6/1995 | Stopperan | |
| 5,600,103 A | 2/1997 | Odaira et al. | |
| 6,326,555 B1 | 12/2001 | McCormack et al. | |
| 6,329,610 B1 | 12/2001 | Takubo et al. | |

(Continued)

FOREIGN PATENT DOCUMENTS

GB    2 294 363 A    4/1996

(Continued)

OTHER PUBLICATIONS

U.S. Appl. No. 10/546,298, filed Aug. 19, 2005, Kawaguchi, et al.

(Continued)

*Primary Examiner*—Jeremy C. Norris
*Assistant Examiner*—Yuriy Semenenko
(74) *Attorney, Agent, or Firm*—Oblon, Spivak, McClelland, Maier & Neustadt, P.C.

(57) ABSTRACT

In a flex-rigid wiring board in which a rigid substrate formed from a rigid base material and a flexible substrate formed from a flexible base material are stack-joined and electrically connected to each other, the flexible substrate including a conductive layer having interconnecting electrode pads provided on at least one surface thereof, and the rigid substrate including a conductive layer having interconnecting electrode pads provided on at least one surface thereof in a position opposite to the interconnecting electrode pads on the rigid substrate, are locally connected electrically to each other with an anisotropic conductive adhesive layer interposed between conductive layers of substrate portions each including at least the interconnecting electrode pads.

10 Claims, 11 Drawing Sheets

U.S. PATENT DOCUMENTS

| | | |
|---|---|---|
| 6,350,365 B1 | 2/2002 | Koyama et al. |
| 6,449,836 B1 | 9/2002 | Miyake et al. |
| 6,570,098 B2 * | 5/2003 | Shimizu et al. ............. 174/255 |
| 6,703,566 B1 | 3/2004 | Shiraishi et al. |
| 6,713,682 B1 * | 3/2004 | Hirahara et al. ............. 174/254 |
| 6,759,600 B2 | 7/2004 | Koyama et al. |
| 2004/0016568 A1 * | 1/2004 | Palanisamy ................. 174/260 |
| 2007/0012475 A1 | 1/2007 | Kawaguchi et al. |

FOREIGN PATENT DOCUMENTS

| | | |
|---|---|---|
| JP | 59-145058 | 9/1984 |
| JP | 05 090756 | 4/1993 |
| JP | 6-45364 | 6/1994 |
| JP | 07 038222 | 2/1995 |
| JP | 07 170076 | 7/1995 |
| JP | 8-125342 | 5/1996 |
| JP | 8-335759 | 12/1996 |
| JP | 10-200256 | 7/1998 |
| JP | 10-256688 | 9/1998 |
| JP | 2000-133944 | 5/2000 |
| JP | 2001-251053 | 9/2001 |
| JP | 2001-267695 | 9/2001 |
| JP | 2001-284747 | 10/2001 |
| JP | 2001-339126 | 12/2001 |
| JP | 2003-110240 | 4/2003 |
| JP | 2003-238709 | 8/2003 |
| JP | 2004-63908 | 2/2004 |

OTHER PUBLICATIONS

U.S. Appl. No. 10/558,289, filed Nov. 28, 2005, Kawaguchi et al.
U.S. Appl. No. 11/629,099, filed Dec. 11, 2006, Mikado, et al.

* cited by examiner

Waveform (1-GHz signal)

Waveform (5-GHz signal)

FLEX-RIGID WIRING BOARD

FIELD OF THE INVENTION

The present invention generally relates to a wiring board including a flexible substrate and rigid substrate, and more particularly to a wiring board characterized in the connection between a flexible substrate and rigid substrate stack-joined to each other in a rigid portion, among others, of the wiring board.

BACKGROUND ART

The recent portable electronic devices such as a foldable mobile phone and the like use a flex-rigid wiring board. Normally in such a wiring board, rigid or non-flexible portions and a flexible portion are joined to each other with a flexible substrate laid between them, and wiring pattern layers on the surfaces of the flexible and rigid substrates stacked together are electrically connected to each other via a plated through-hole conductive layer in the rigid portion as shown in FIG. 12 (as disclosed in the Japanese Patent Application Laid Open No. 90756 of 1993, for example).

Also, there has been proposed a flex-rigid circuit board in which a multilayer rigid substrate has formed at either end thereof a cut in which an end electrode of a flexible substrate is fitted, the end portion of the flexible substrate is laid between the outermost sides of the rigid substrate and the electrode of the rigid substrate and that of the flexible substrate are electrically connected to each other (as disclosed in the Japanese Patent Application Laid Open No. 170076 of 1995, for example).

However, the wiring board in which a flexible substrate and rigid substrate are electrically connected to each other through a plated through-hole with the above-mentioned conventional wiring-board technology is not advantageous in that when it is used with a frequency of higher than 1 GHz, signal propagation is delayed and high-speed signal transmission is not stable. Especially when the wiring board is used with a frequency of higher than 5 GHz, the signal propagation is more seriously delayed and instability of the high-speed signal transmission is greater.

Also, the wiring board produced with the conventional wiring-board technology was found, as a result of the reliability test made in the cooling/heating cycle test, to have the electrical connection thereof deteriorated. That is, for the electrical connection through the plated through-hole in the flexible and rigid substrates, the conductive layer in the through-hole is formed by plating. Therefore, the conductive layer varies in thickness so that some of connecting terminals are not connected, namely, so-called "open" terminals are resulted.

Further, since the conventional flex-rigid wiring board is formed either by fixing a flexible substrate to an outermost rigid substrate with an anisotropic adhesive or by laying a flexible substrate between both outermost rigid substrates, so it cannot be designed thinner.

DISCLOSURE OF THE INVENTION

The present invention has an object to overcome the above-mentioned drawbacks of the related art by providing a flex-rigid wiring thinner than the conventional one and that is excellent in electrical properties and reliability of the conductive layer penetrating flexible and rigid substrates, can transmit high-frequency electrical signals with a less delay and has a connecting structure more advantageous for assuring a stable signal transmission.

The inventors of the present invention had devoted themselves to attaining the above object. The inventors found it possible to transmit GHz-level electrical signals with an improved stability by electrically connecting a rigid substrate and flexible substrate not through the plated through-hole as in the conventional technology but via an anisotropic conductive adhesive layer interposed between conductive layers of substrate portions including interconnecting electrode pads, and thus worked out the present invention.

(1) The above object can be attained by providing a flex-rigid wiring board in which a rigid substrate formed from a rigid base material and a flexible substrate formed from a flexible base material are stack-joined and electrically connected to each other, wherein:

the flexible substrate including a conductive layer having interconnecting electrode pads formed on at least one surface thereof, and the rigid substrate including a conductive layer having interconnecting electrode pads formed on at least one surface thereof in a position opposite to the interconnecting electrode pads on the rigid substrate, are electrically connected to each other with an anisotropic conductive adhesive layer interposed between conductive layers of substrate portions each including at least the interconnecting electrode pad.

In the above flex-rigid wiring board according to the present invention, either the flexible or rigid substrate has provided on the surface thereof a coverlay having formed therein an opening through which the interconnecting electrode pads are exposed and that is filled with the anisotropic conductive adhesive.

According to the present invention, a plurality of the interconnecting electrode pads exposed through the respective openings formed in the coverlay on the flexible substrate may be provided in such openings adjacent to each other and spaced 20 to 500 μm from each other.

Further according to the present invention, the flexible substrate may have formed therein a via-hole formed from a through-hole extending from the substrate top to bottom and filled with a conductive substance and the interconnecting electrode pads be provided just above the via-hole.

Note that in the above flex-rigid wiring board structure according to the present invention, the wording "flexible substrate" or "rigid substrate" refers to both "single-layer" and "multilayer" substrate.

In the flex-rigid wiring board (1) according to the present invention, since the flexible and rigid substrates are joined integrally to each other with the anisotropic conductive adhesive layer interposed between the conductive layers of the substrate portions including the interconnecting electrode pads disposed at least opposite to each other, the interconnecting electrode pads on the flexible substrate can electrically be connected to that of the rigid substrate to provide an excellent electrical connection and improved connection stability, whereby it is possible to transmit a high-frequency signal with a less delay and a stability that can be attained quickly.

More specifically, when a flexible substrate and rigid substrate are electrically connected to each other through a plated through-hole as with the conventional technology, electrical signals will diffuse inside the plated through-hole and their transmission be delayed. However, in the flex-rigid wiring board according to the present invention in which a flexible substrate and rigid substrate are electrically connected through an anisotropic conductive adhesive layer, electrical signals can be transmitted without being diffused, so that a high-frequency signal can be transmitted with a less delay and a quickly attained stability.

Also, by forming a plurality of interconnecting electrode pads on the flexible substrate and setting the distance between adjacent openings through which these interconnecting electrode pads are exposed, that is, the distance from the edge of one of the adjacent openings to that of the other opening (spacing distance), to 20 to 500 μm, the local electrical connection between the flexible and rigid substrates via the anisotropic conductive adhesive can positively be made and the flex-rigid wiring board be designed smaller.

Further, by forming a through-hole extending from the substrate top to bottom of the flexible substrate and filling the through-hole with the conductive substance to provide a via-hole and providing interconnecting electrode pads just above the via-hole, it is possible to assure a coincidence between the position of an interlayer connector at the flexible substrate and that of an interlayer connector at the rigid substrate. Also, by forming a stacked structure in which the interlayer connectors are stack-joined and electrically connected to each other, it is possible to provide a flex-rigid wiring board in which the wiring length is shorter and that is thus suitable for mounting thereon electronic parts that need a large power for their operation.

(2) Also the above object can be attained by providing a flex-rigid wiring board comprising:

a flexible substrate formed from a flexible base material, having a plurality of first interconnecting pads located at opposite ends thereof and a plurality of first conductor layers connected to the first interconnecting pads, respectively;

a rigid substrate formed from a rigid base material, disposed under the flexible substrate and having a frame pattern provided correspondingly to the ends of the flexible substrate, a plurality of second interconnecting pads surrounded by the frame pattern, a plurality of via-contacts disposed beneath the second interconnecting pads and a second conductor layer connected to each of the via-contacts, the rigid substrate being joined to the flexible substrate;

a coverlay provided between the first conductor layers and frame pattern and that electrically insulates the frame pattern from the first conductor layers; and an anisotropic conductive adhesive layer formed to provide a compression connection between the first and second interconnecting pads.

(3) Also the above object can be attained by providing a flex-rigid wiring board in which a rigid substrate formed from a stack of rigid base materials and a flexible substrate formed from a flexible base material are joined to each other, wherein:

the rigid substrate includes a first rigid-substrate layer having a cut formed at either end thereof and a second rigid-substrate layer disposed under the first rigid-substrate layer;

the second rigid-substrate layer includes a frame pattern formed to be exposed from the cuts in the first rigid-substrate layer, a plurality of second interconnecting pads formed in an area surrounded by the frame pattern, a plurality of via-contacts formed beneath the second interconnecting pads, respectively, and a second conductor layer connected to each of the via-contacts;

there is provided between the first conductor layers and frame pattern a coverlay that electrically insulates the frame pattern from the first conductors; and there is provided an anisotropic conductive adhesive layer to provide a compression connection between the first and second interconnecting pads.

In the above flex-rigid wiring boards (2) and (3) according to the present invention, the first and second interconnecting pads included in the flexible and rigid substrates, respectively, are substantially equal in width to each other and clearances between adjacent interconnecting pads are substantially identical to each other, whereby the first and second interconnecting pads can uniformly be connected to each other.

Also, according to the present invention, in the area surrounded by the frame pattern provided on the second rigid-substrate layer, there is formed a plurality of through-holes to discharge excessive conductive adhesive, whereby it is possible to reduce the occurrence of voids in the conductive adhesive layer.

Further, a plated nickel/gold layer is formed on the surface of each of the first and second interconnecting pads included in the flexible and rigid substrates, respectively, to assure a local electrical connection between the flexible and rigid substrates with the conductive adhesive layer.

(4) Also the above object can be attained by providing a method of producing a flex-rigid wiring board in which a rigid substrate formed from a stack of rigid base materials and a flexible substrate formed from a flexible base material are joined to each other, the method comprising the steps of:

preparing a flexible substrate including a plurality of first interconnecting pads and a plurality of first conductor layers connected to the first interconnecting pads, respectively;

preparing a first rigid-substrate layer having a cut formed at either end thereof while preparing a second rigid-substrate layer including a frame pattern exposed through the cuts, a plurality of second interconnecting pads formed in an area surrounded by the frame pattern, a plurality of via-contacts formed beneath the second interconnecting pads, respectively, and a second conductor layer connected to each of the via-contacts;

stacking the first and second rigid-substrate layers together to form a rigid substrate;

forming a coverlay between the first conductor layers of the flexible substrate and frame pattern of the second rigid-substrate layer to electrically insulate the frame pattern from the first conductor layers;

forming an anisotropic conductive adhesive layer between the first interconnecting pads of the flexible substrate and second interconnecting pads of the rigid substrate; and fitting the free end of the flexible substrate into the cut in the rigid substrate to provide a compression connection between the first and second interconnecting pads via the anisotropic conductive adhesive layer.

As having been described with the above flex-rigid wiring boards (2) to (4), the present invention provides a flex-rigid wiring board thinner than the conventional flex-rigid wiring board having a connecting structure advantageous for assuring a stable signal transmission.

BEST MODE FOR CARRYING OUT THE INVENTION

Figure 1A:
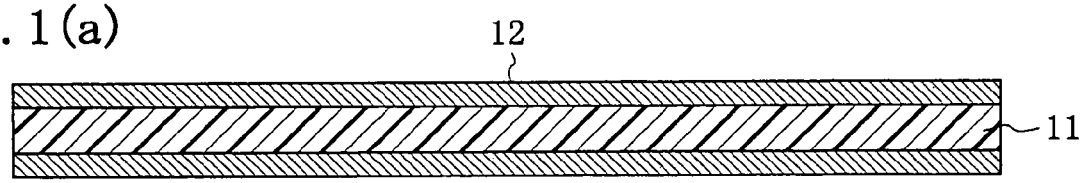
FIGS. 1(a) to 1(g) show some steps of a process of producing a flex-rigid wiring board according to example 1 of the present invention.

In the flex-rigid wiring board according to the present invention, a rigid substrate having interconnecting electrode pads provided thereon is placed on a flexible substrate having interconnecting electrode pads provided thereon with an anisotropic conductive adhesive layer being laid between the interconnecting electrode pads in an area where the substrates are stacked together, and pressed to each other to make the anisotropic conductive adhesive layer locally conductive for electrical connection between the interconnecting electrode pads while the remainder of the anisotropic conductive adhesive layer is being left not conductive as an insulative adhesive. Because of this structure, it is possible to reduce the delay of high-frequency signal transmission and quickly stabilize such signal transmission. Also, the flex-rigid wiring board according to the present invention is excellent in electrical connection and stability.

The embodiments of the present invention should desirably be of a structure in which a plurality of rigid substrates is stack-joined to a single flexible substrate to provide a multi-layer wiring board for the reason that by increasing or decreasing the number of rigid substrates as necessary, the flex-rigid wiring board can easily be adapted to the shapes of parts to be mounted on the wiring board and a casing of a mobile phone, for example, in which the flex-rigid wiring board is to be assembled.

Interconnecting electrode pads should desirably be formed in an area on one or either side of each of the rigid and flexible substrates, where these substrates are stacked together, because the number of rigid substrates to be stacked on the flexible substrate can easily be increased, the flexible and rigid substrates can positively be connected electrically and physically to each other, and the interconnecting electrode pads can be formed with an improved precision.

In this embodiment of the present invention, the rigid substrate may be connected to a plurality points to the flexible substrate, each of the rigid substrates be formed from multiple layers of conductive material and insulative resin or a single layer of either of the conductive material and insulative resin, and each of the rigid substrates thus individually formed be stack-joined to one or either side of the flexible substrate with an anisotropic conductive adhesive layer laid between them.

The flexible substrate should preferably have via-holes formed therein, and interconnecting electrode pads preferably be provided nearly just above the via-holes, respectively.

The interlayer connection structure including the via-holes, interconnecting electrode pads and conductive layer should preferably be a stacked structure in which the interlayer connector at the rigid substrate is aligned with that at the flexible substrate and these interlayer connectors are stack-joined and electrically connected to each other. So-called stacked structure can implement a flex-rigid wiring board in which the wiring length is shorter and that is thus suitable for mounting thereon electronic parts that need a large power for their operation.

According to the present invention, the flexible substrate may be an appropriately flexible one, such as a plastic substrate, metal substrate, film substrate or the like. More specifically, it may be a substrate selected from among a glass epoxy substrate, glass polyimide substrate, aluminum substrate, iron substrate, polyimide film substrate, polyethylene film substrate or the like.

Among others, a substrate using a polyimide film as the base material is suitably usable as the flexible substrate in the present invention. The flexible substrate should preferably be a flexible circuit board having a conductive circuit formed on either side or one side thereof.

The flexible substrate should be approximately 5 to 100 µm thick. If the flexible substrate is thinner than 5 µm, it will be poorer in electrical insulation. On the other hand, if the flexible substrate is thicker than 100 µm, it will be less flexible.

The above-mentioned conductive circuit is formed on one or either side of the flexible substrate by plating the surface of an insulative film or etching a metal foil on an insulative film. It should be noted that the interconnecting electrode pads should desirably be formed as part of the conductive circuit.

The conductive circuit formed on the flexible substrate should be approximately 3 to 75 µm in thickness. If the conductive circuit is thinner than 3 µm, it will not have any satisfactorily reliable connectivity. On the other hand, if the conductive circuit is thicker than 75 µm, it will be lower in reliability on flexibility.

The interconnecting electrode pads may be formed as a via-land, which permits an electrical connection with a different rigid substrate that will be connected to either side of the flexible substrate through the via-hole as will be described in detail later.

The interconnecting electrode pads formed on the flexible substrate are not specially limited in shape, size and number. However, it should preferably be formed circular to have a diameter of 50 to 500 µm and be disposed in a plurality of places with a spacing of 20 to 500 µm. If the spacing is less than 20 µm, the interconnecting electrode pads will not assure any sufficiently reliable connection. If the spacing is larger than 500 µm, the interconnecting electrode pads will rather interfere with high-density packaging of electronic parts on the flex-rigid wiring board.

On the surface of the flexible substrate, there should desirably be formed a coverlay that provides an electrical insulation between the conductive circuits. The coverlay should preferably be formed mainly from any one of insulative resins such as a light-curable resin, thermo-setting resin and the like, more particularly, from polyimide adhesive, epoxy adhesive or the like, for example.

The coverlay should preferably have a thickness 1.4 times or less than that of the interconnecting electrode pads formed on the flexible substrate. If the coverlay thickness is 1.4 times or less than the thickness of the interconnecting electrode pads, the anisotropic conductive adhesive is easily connectable to the interconnecting electrode pads and conductive particles in the anisotropic conductive adhesive are On the other hand, if the coverlay has a thickness larcier than 1.4 times that of the interconnecting electrode pads, anisotropic conductive adhesive and interconnecting electrode pads will be likely not to be electrically connected to each other. That is, the anisotropic conductive adhesive is likely not to be in contact with the interconnecting electrode pads and the conductive particles of the anisotropic conductive adhesive will be distributed inhomogeneously, as the case may be.

For example, in case the conductive circuit should preferably be 18 μm thick and the interconnecting electrode pads are formed as part of the conductive circuit, the coverlay should preferably be formed to have a thickness less than 25 μm, more preferably, a thickness of 20 μm or 13 μm, for example.

In the coverlay, openings are formed in positions corresponding to the interconnecting electrode pads. The diameter of the openings is equal to or larger than that of the interconnecting electrode pads. The openings are filled with the anisotropic conductive adhesive.

With the anisotropic conductive adhesive filled in the openings formed in the coverlay, the flexible substrate and rigid substrates can be easily positioned in relation to each other for a stack-joining and the pressure is so concentrated to the anisotropic conductive adhesive layer between the interconnecting electrode pads disposed opposite to each other that the anisotropic conductive adhesive layer thus pressed will locally be conductive. Thus, the interconnecting electrode pads can positively be connected electrically to each other.

Also, with the coverlay being provided on the flexible substrate, the flexible substrate more flexible than the rigid substrates and coverlay thus provided can reduce any excessive pressure applied to the rigid substrates when the rigid substrates are pressed toward the flexible substrate with the formed being positioned in relation to the latter. On the other hand, since the anisotropic conductive adhesive layer is easily filled in the openings in the coverlay on the flexible substrate even if the pressure applied to the rigid substrates is too small, the electrical connection between the interconnecting electrode pads can be kept well.

Further, the coverlay may be provided on only the flexible substrate, not on the rigid substrate. In this case, when the interconnecting electrode pads are exposed on the surface of the rigid substrates, the pressure can easily be transmitted by the exposed interconnecting electrode pads to the flexible substrate and coverlay on the flexible substrate and the conductive particles in the anisotropic conductive adhesive layer between the interconnecting electrode pads easily gather together. Thus, the interconnecting electrode pads can positively be connected electrically to each other.

The diameter of the openings formed in the coverlay should desirably be within a range of 50 to 450 μm. If the opening diameter is less than 50 μm, the anisotropic conductive adhesive is not easily be filled in the openings. On the other hand, if the opening diameter is more than 450 μm, the conductive particles included in the anisotropic conductive adhesive are not easily gathered together. An opening diameter of 100 to 300 μm is suitable for filling the anisotropic conductive adhesive into the openings.

The clearance between the opening rim and interconnecting electrode pad should preferably be within a range of 10 to 100 μm. If the clearance is less than 10 μm, the interconnecting electrode pads cannot easily be positioned in relation to each other. If the clearance exceeds 100 μm, no desirable opening shape cannot be assured because the interconnecting electrode pads in adjacent openings will possibly be in contact with each other.

The two adjacent openings should desirably be spaced about 20 to 500 μm from each other (this spacing is the shortest length of a line connecting the rims of the two adjacent openings). The following will account for the above. If the spacing is less than 20 μm, the resin included in the anisotropic conductive adhesive congregates too much to between the openings. Thus, the elongation percentage of the anisotropic conductive adhesive will not be proportional with the coefficient of thermal expansion of the resin between the two openings. Thus, the stress incident to a thermal change will easily concentrate to between the adjacent openings and cause a crack or the like. Even with the resin included in the anisotropic conductive adhesive being congregated, the conductive particles in the adhesive layer flow out to the adjacent conductor layers and cannot easily be gathered to a desired density. Thus, no desired electrical connection can be assured between the interconnecting electrode pads. On the other hand, if the spacing exceeds 500 μm, corresponding to the ratio of a metal particle concentration portion and a metal particle distribution portion, the metal particle distribution portion contained in the resin in anisotropic conductive adhesives will increase too much. Therefore, as for the resin of a metal particle concentration portion and a metal particle distribution portion, the heat rate of expansion is different. That is, it becomes easy to concentrate the stress by heat change between a metal particle concentration portion and a metal particle distribution portion, in this stress concentration portion occurs crack or the like. Also, the spacing more than 500 μm cannot lead to a higher-density circuit board and thus to a smaller portable electronic device.

Therefore, when the spacing between the adjacent openings is within the above range, the anisotropic conductive adhesive layer will assure a location electrical connection between the flexible and rigid substrates, which meets the requirement for a more compact design of the portable electronic device.

The rigid substrate included in the embodiments of the present invention is a substrate "not flexible" like the flexible substrate that is "flexible". It should be rigid, not easily deformable, independently of its form, number, method of preparation, etc. The insulative-resin base material of the rigid substrate included in the embodiments of the present invention should preferably be selected from among a glass fabric epoxy resin base material, glass fabric bismaleimide triazine resin base material, glass fabric polyphenylene ether resin base material, aramid nonwoven fabric-epoxy resin base material and aramid nonwoven fabric-polyimide resin base material. Among these base materials, the glass fabric epoxy resin base material is the most preferable one.

The insulative-resin base material should be on the order of 50 to 600 μm in thickness. If the thickness is less than 50 μm, the insulative-resin base material is lower in strength and cannot easily be handled, and the reliability on the electrical insulation will be lower. With a thickness exceeding 600 μm, any fine via-hole cannot easily be formed through the substrate and cannot easily be filled with conductive material, and the substrate itself will be thicker.

Also, the insulative-resin base material is plated on one or either side thereof with a copper foil having a thickness of 5 to 75 μm. If the thickness is smaller than 5 μm, when an opening for a via-hole is formed in the insulative-resin base material by a laser processing that will be described in detail later, the laser will penetrate the base material of this thickness. On the other hand, with a thickness of more than 75 µm, it will be difficult to form, by etching, an electrical circuit pattern having thin conductors.

The insulative-resin base material with the copper foil may be, among others, a single-sided copper clad laminate which can be formed by stacking together a prepreg formed by impregnating a glass fabric with an epoxy resin and cured to the B stage and a copper foil and pressing them at a high temperature. Such a rigid substrate is excellent in accuracy of positioning without any displacement of the wiring pattern and via-hole positions during handling after etching the copper foil as will be described in detail later.

The conductor circuit formed on one or either side of the insulative-rein base material should preferably be formed by pressing, at a high temperature, the copper foil of about 5 to 75 µm in thickness via a resin adhesive layer kept in a tack-free state (B-stage) and then etching it appropriately. The conductor circuit thus formed should desirably be 5 to 50 µm thick.

The conductor circuit on the insulative-resin base material should preferably be formed by attaching an anti-etching film on the copper foil attached to the base-material surface, masking the film with a predetermined circuit pattern and etching the copper foil to form a conductor circuit including electrode pads (via-lands).

In the above electrical circuit forming process, a photosensitive dry film resist is first attached to the surface of the copper foil, then exposed to light along the predetermined circuit pattern and developed to form an etching resist, and the metal layer where no etching resist is formed is etched to form a conductor circuit including electrode pads.

The etchant used in the above process may be at least one selected among aqueous solutions of sulfuric acid-hydrogen peroxide, persulfate, cupric chloride and ferric chloride.

The via-hole opening should desirably be formed in the insulative-resin base material by laser processing. More specifically, a transparent protective film, for example, a PET (polyethylene terephthalate) film, is attached to the surface of the insulative-resin base material, and carbon-dioxide laser is irradiated to the PET film from above to form an opening penetrating the PET film and extending from the surface of the insulative-resin base material to the copper foil.

The via-hole opening should desirably have a diameter of about 50 to 250 µm. If the opening diameter is less than 50 µm, it is difficult to adopt desmearing and copper plating. On the other hand, a via-hole opening diameter of more than 250 µm cannot be formed well by the laser processing.

Also, for removing resin left on the side and bottom surfaces of the opening formed by the laser processing, desmearing should desirably be adopted.

The desmearing should desirably be done by any of oxygen plasma discharge, corona discharge, ultraviolet laser irradiation and excimer laser irradiation.

The opening formed by the laser processing should preferably be filled with a conductive material such as a conductive paste or a metal plating formed by electroplating.

For simplification of the filling process to reduce the manufacturing cost and improve the yield, the via-hole opening should preferably be filled with a conductive paste. For an improved connection reliability, the via-hole opening should preferably be filled with a metal plating formed by electroplating, such as copper, tin, silver, various types of solders, copper/tin, copper/silver or the like. Among others, the electrocopper is optimum as the metal plating for filling in the via-hole opening.

The conductive material may not only be filled in the opening penetrating the insulative-resin base material and extending to the conductor circuit but also be projected to a predetermined height out of the opening. The projection height should desirably be within a range of 5 to 30 µm. If the projection height is less than 5 µm, the connection is likely to be poor. With a projection height exceeding 30 µm, the resistance of the conductive material will be higher, and the conductive material will be dispersed too much along the surface of the insulative-resin base material and no fine pattern can be formed when it is thermally deformed in the hot-pressing process.

According to the present invention, the interconnecting electrode pads are formed on the outermost surface of the rigid substrate. Similarly to the interconnecting electrode pads on the flexible substrate, the shape, size and number of the interconnecting electrode pads formed on the rigid substrate are not limited to any specific ones. However, the pads should preferably be formed to have a circular shape whose diameter is about 150 to 450 µm and be disposed in a plurality of places spaced about 20 to 500 µm from each other. With a pad diameter of less than 20 µm, the connection between the interconnecting electrode pads is not highly reliable. With a diameter exceeding 500 µm, the pads will occupy increased areas, which is disadvantageous for a higher density of packaging. Also, the anisotropic conductive adhesive will adversely be influenced by the reliability test so that it will possibly have the connection reliability thereof lowered.

With no coverlay being formed on the surface of the flexible substrate, a coverlay or solder resist layer may be formed on the outermost surface of the rigid substrate to provide electrical insulation between the conductor circuits.

Similarly to the coverlay formed on the flexible substrate, the above coverlay should preferably be formed mainly from an insulative resin such as a photosensitive solder resist or the like and have a thickness 1.4 times smaller than that of the interconnecting electrode pads formed on the rigid substrate.

For example, in case the conductor circuit formed on the rigid substrate is 18 µm thick and interconnecting electrode pads are formed as parts of the conductor circuits, the coverlay thickness should preferably be less than 25 µm, for example, 20 or 13 µm.

Such a coverlay should preferably have formed in positions corresponding to the interconnecting electrode pads openings whose diameter is equal to or larger than that of the interconnecting electrode pads.

The diameter of the openings in the coverlay should desirably be within a range of 50 to 300 µm (50 to 450 µm in the flexible substrate). If the opening diameter is less than 50 µm, the opening cannot easily be filled with the anisotropic conductive adhesive. An opening diameter of more than 300 µm will make it difficult for the conductive particles in the anisotropic conductive adhesive to be gathered together.

The clearance between the opening rim and interconnecting electrode pad should preferably be within a range of 10 to 100 µm. If the clearance is less than 10 µm, the interconnecting electrode pads cannot easily be positioned in relation to each other. If the clearance is more than 100 µm, the opening cannot be shaped as desired because the interconnecting electrode pads in adjacent openings will possibly be in contact with each other.

The two adjacent openings should desirably be spaced about 20 to 500 µm from each other (this spacing is the shortest length of a line connecting the rims of the two adjacent openings). If the spacing is less than 20 µm, cracking will possibly occur and it is difficult to assure a desired electrical connection. On the other hand, if the spacing is more than 500 µm, cracking will possibly take place and the requirement for a higher-density packaging, which will make it difficult to design a smaller portable electronic device using the flex-rigid wiring board according to the present invention. Also, the connection reliability will possibly be lower under the influence of the reliability test.

In the flex-rigid wiring board according to the present invention, the rigid and flexible substrates, each interlayer-connected in advance, may be connected electrically to each other in any of the following manners (1) to (4). By adopting an arbitrary combination of these connecting manners, the substrate material can effectively be used and the substrates be connected to each other with a high freedom of wiring.

(1) In case a flexible substrate is connected to one side of a rigid substrate, interconnecting electrode pads are formed as interlayer connectors on one outermost surface of the rigid substrate, and interconnecting electrode pads are also formed as interlayer connectors on one side of the flexible substrate. The interconnecting electrode pads on the respective substrates are electrically to each other via an anisotropic conductive adhesive.

(2) Next, in case different flexible substrates are connected to both sides of a rigid substrate, respectively, that is, in case an interconnecting electrode pad is formed as an interlayer connector on either outermost surface of the rigid substrate and each of the flexible substrates having an interconnecting electrode pad formed as an interlayer connector formed thereon is disposed opposite to the interconnecting electrode pad formed on either side of the rigid substrate to connect the opposite interconnecting electrode pads to each other via an anisotropic conductive adhesive.

(3) In case different rigid substrates are connected to both sides of a flexible substrate, respectively, an interconnecting electrode pad is formed as an interlayer connector on either side of the flexible substrate and an interconnecting electrode pad is formed on one outermost surface of each of the different rigid substrates, the interconnecting electrode pads on the flexible substrate are disposed opposite to those formed on the different rigid substrates, respectively, and the interconnecting electrode pads thus disposed opposite to each other are electrically connected via an anisotropic conductive adhesive.

(4) In case a plurality of rigid substrates is connected electrically in a plurality of places to a flexible substrate, each of the rigid substrates is pre-formed from an arbitrary number of conductive layers and an arbitrary number of insulative resin layers, interconnecting electrode pads formed on the rigid and flexible substrates to be opposite to each other are electrically connected to each other via an anisotropic conductive adhesive.

Among the above four connecting manners (1) to (4), the fourth one (1) in which the rigid substrate is connected in a plurality of places to the flexible substrate will be explained herebelow.

In an example of the flex-rigid wiring boards formed in the manner (4), a rigid substrate interlayer-connected in advance (will be referred to as "one rigid portion" hereunder) is joined to either side of one end portion of a flexible substrate, and another rigid substrate interlayer-connected in advance (will be referred to as "other rigid portion" hereunder) is joined to either side of the other end portion of the flexible substrate.

In the flex-rigid wiring board of this structure, the portion between the opposite end portions of the flexible substrate is not in contact with the rigid substrates (will be referred to as "flexible portion" hereunder). The flexible portion has provided thereon a conductor circuit that provides an electrical connection between the one and other rigid portions. The conductor circuit is normally covered with an insulative layer called "coverlay".

In a predetermined area of one side of the flexible substrate that forms each of the rigid portions, for example, in the surface area along the short side of an elongated rectangular substrate, there are pre-formed a plurality of interconnecting electrode pads as a part of the conductor circuit. On the flexible substrate, there is formed an insulative layer having formed therein an opening through which the interconnecting electrode pads are exposed outside. On the other hand, in a predetermined area of the outer surface of the interlayer-connected rigid substrate where the conductor circuit and insulative layer are pre-stacked, a plurality of interconnecting pads is also pre-formed correspondingly to the interconnecting electrode pads provided on the flexible substrate.

With the interconnecting electrode pads formed on the flexible substrate and those formed on the rigid portions being disposed opposite to each other, the flexible and rigid portions are stacked and hot-pressed together. Thus, a plurality of pairs of interconnecting electrode pads on the rigid portions are electrically connected to each other via the anisotropic conductive adhesive layer on the flexible substrate, and the flexible substrate and rigid portions are joined to each other with the anisotropic conductive adhesive layer in the surface area other than the interconnecting electrode pads.

The interconnecting electrode pads can be formed as parts of the conductor circuit that is formed by plating or etching of one or two of the circuit substrates forming the outermost layer of the rigid substrate. However, they may be formed singly on the insulative resin layer of the circuit substrate as the outermost layer or they may be formed as via-hole lands that provide an electrical connection with the conductor circuit as a lower layer through the insulative resin layer.

In this embodiment, the interconnecting electrode pads have not to be formed over the outermost insulative resin layer surface of the rigid substrate but may be formed in arbitrary places where a sufficient strength of connection between the pads can be assured.

For example, the interconnecting electrode pads may be formed in a marginal surface area along the short or long side of the rectangular substrate or a surface area extending from the edge to center of the substrate.

Since the interconnecting electrode pads may thus be formed in arbitrary places, the wires can be led out in a desired direction depending upon he design of an electronic device housing and layout of other rigid substrates and electronic parts provided inside the housing. Namely, the structure of wire connection in the flex-rigid wiring board according to the present invention is very advantageous.

In this embodiment, the "anisotropic conductive adhesive" that joins and fixes the rigid substrates and flexible substrate to each other and also electrically connects the interconnecting electrode pads formed on the rigid substrates and flexible substrate, respectively, is a resin adhesive containing an insulative resin and conductive particles dispersed in the resin. When pressed, the adhesive provides an electrical conduction or connection.

The anisotropic conductive adhesion contains, for example, a thermosetting epoxy resin and 6 μm-diameter nickel particles each having a gold-plated surface and dispersed as conductive particles in the resin.

The resin in the anisotropic conductive adhesive is a thermosetting epoxy resin or the like as above.

Also, the conductive particles may be gold-plated resin particles, nickel or silver particles coated with an insulative resin in addition to the gold-plated nickel particles.

The conductive particles should desirably have a mean particle size of 3 to 15 μm. If the mean particle size is less than 5 μm, the particles cannot easily be dispersed homogeneously in the resin. On the other hand, if the mean particle size is more than 15 μm, the anti-migration property of the particles will be lower.

The anisotropic conductive adhesive layer in which the conductive particles are dispersed in the above-mentioned resin should desirably be 15 to 55 μm in thickness. If the thickness is less than 15 μm, the conductor pattern cannot satisfactorily be embedded in the adhesive layer. On the other hand, if the thickness is more than 55 μm, the resin will flow extensively and the area of adhesion will be wider.

Note that each of the interconnecting electrode pads formed on the rigid substrates and flexible substrate, respectively, in the flex-rigid wiring board according to the present invention may have the surface thereof plated with nickel-gold with the normal technique. The nickel-gold plating will assure a positive electrical connection between the conductive particles in the anisotropic conductive adhesive and the interconnecting electrode pads.

The flex-rigid wiring board according to the present invention will be described in detail below concerning the examples of the present invention:

EXAMPLE 1

(A) Preparing a Flexible Substrate (1) For producing the flex-rigid wiring board as the example 1 of the present invention, a laminated film (ES-PANEX SB by Shin-Nittetsu Chemicals) formed from a 25 μm-thick insulative film 11 of polyimide resin having a 30 μm-thick copper foil 12 laminated on either side thereof (as in FIG. 1(a)) is used as a base material for preparation of a flexible substrate 100A included in the flex-rigid wiring board.

Figure 1B:
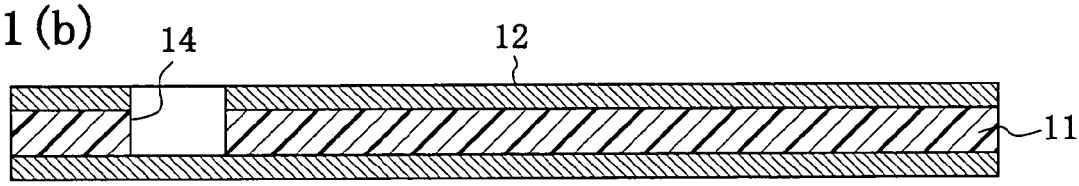

(2) A resist layer is formed on the copper foil on the laminated film, and exposed to light and developed to form a circular opening of 300 μm in diameter. The copper foil was etched using a cupric chloride aqueous-solution to form the opening in the copper foil. Carbon-dioxide laser or the like is irradiated to the opening to form an opening 14 that penetrates the resin layer to the copper foil on the back of the insulative film (as in FIG. 1(b)).

Figure 1C:
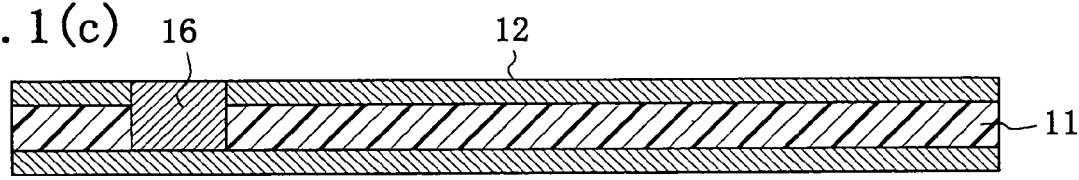

(3) The opening 14 formed in the step (2) above is fully filled with copper by electrocopper plating to form a via-hole 16, and then the resist layer is removed (as in FIG. 1(c)).

Figure 1D:
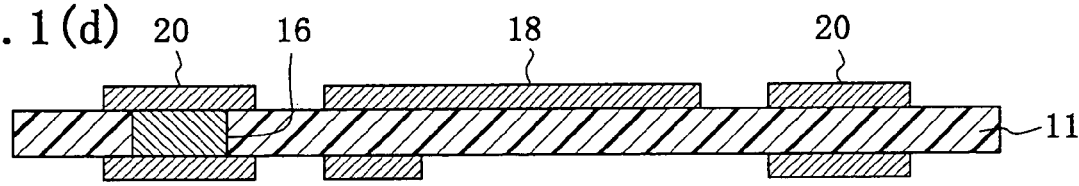

(4) A resist layer is laminated on the copper foil 12 laminated on either side of the insulative film 11, and exposed to light and developed, and then etched using a cupric chloride aqueous-solution to form a 30 μm-thick wiring pattern 18 and interconnecting electrode pads 20 of 250 μm in diameter and 30 μm in thickness (as in FIG. 1(d)).

Figure 1E:
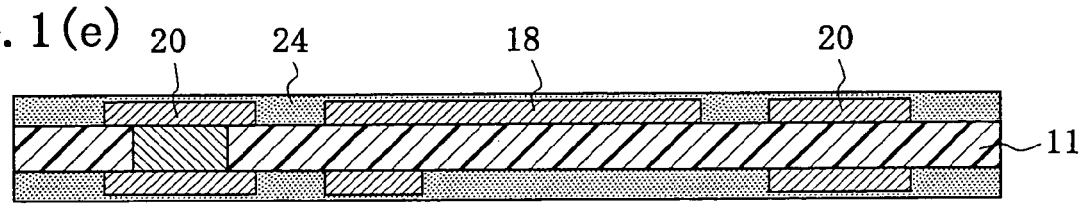
Figure 1F:
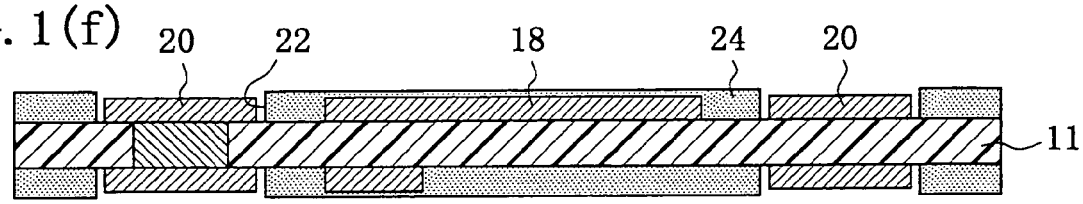

(5) A photosensitive epoxy resin (FR-5538EA by Hitachi Chemical) is applied to the wiring pattern 18 including areas where the interconnecting electrode pads 20, dried at 80° C. for 3 hours (as in FIG. 1(e)), then exposed to ultraviolet rays, and developed using dimethyleneglycol diethylether to form a cover layer 24 as nearly thick (30 μm) as the wiring pattern 18 and having which has formed therein 300 μm-diameter openings 22 through which the interconnecting electrode pads 20 are exposed, respectively. See FIG. 1(f).

Note that the openings 22 are formed in 16 places along the short side of the flexible substrate and the space between the adjacent openings 22 is 100 μm.

Figure 1G:
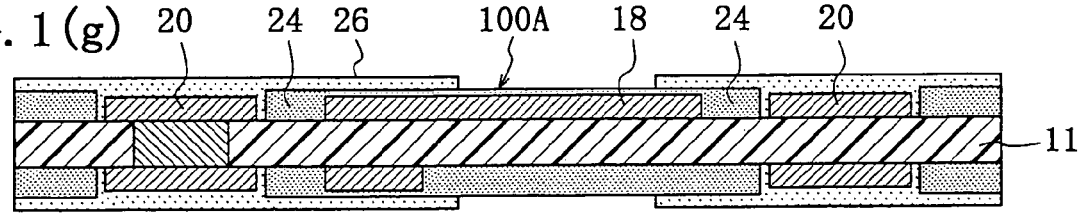

(6) An anisotropic conductive film (CP9472KS by Sony) as nearly large as an area overlapping the rigid substrate is attached to either side to cover the area where the coverlay 24 formed in the step (5) above and an area where no coverlay is formed. The conductive film provides an anisotropic conductive adhesive layer 26. The adhesive layer 26 is attached to each copper foil 12. The substrate thus prepared is a flexible substrate 100A (as in FIG. 1(g)).

The anisotropic conductive adhesive layer 26 may be formed by attaching an anisotropic conductive film under pressure. Alternatively, it may be formed by provisionally attaching an anisotropic conductive film under pressure in such a manner that the anisotropic conductive adhesive layer 26 will not be displaced.

Also the anisotropic conductive adhesive layer 26 may be formed by applying an anisotropic conductive resin. In this case, the anisotropic conductive adhesive layer 26 may be cured completely or to the B stage.

Figure 2A:
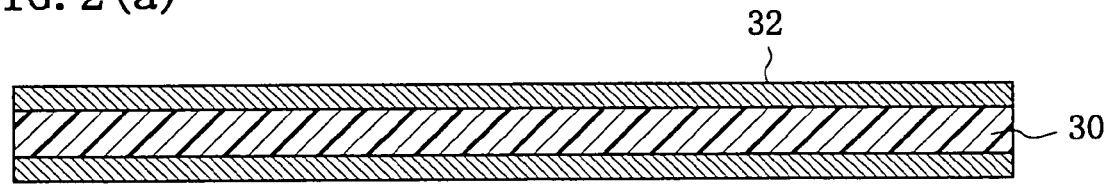
FIGS. 2(a) to 2(e) show other steps of a process of producing the flex-rigid wiring board according to example 1 of the present invention.
Figure 2B:
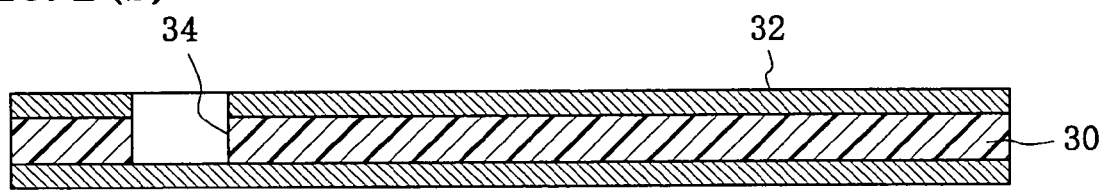

(B) Preparing a Rigid Substrate (1) A 0.11-mm double-sided copper-clad laminate (R-1766 by Matsushita Electric; (as in FIG. 2(a)) including a rigid substrate 30 of glass epoxy resin having a 12 μm-thick copper foil 32 laminated on either side thereof is prepared, and etched at one side thereof with a cupric chloride aqueous-solution to form a laser irradiating opening. Further, a 250 μm-diameter copper-plating filling opening 34 is formed in the rigid substrate 30 by irradiating carbon-dioxide laser (as in FIG. 2(b)).

Figure 2C:
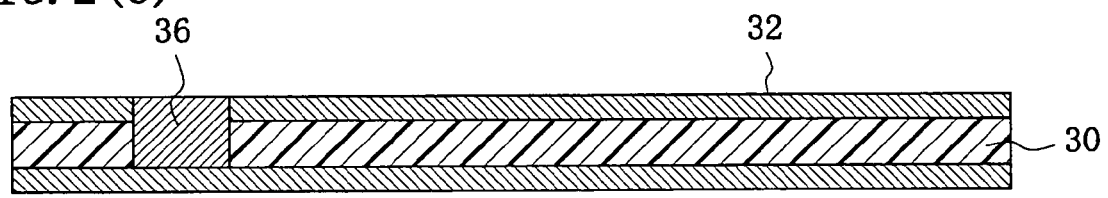

(2) Further, a Pd catalyst is applied to the inner wall of the opening 34, the inner wall is plated with electroless copper and then with electrocopper in a plating solutions and under conditions as will be given below, to thereby fill the opening 34 with copper plating to form a via-hole 36 (as in FIG. 2(c):

| (Electroless copper plating solution) | |
|---|---|
| Copper sulfate: | 10 g/liter |
| HCHO: | 8 g/liter |
| NaOH: | 5 g/liter |
| Rochelle salt: | 45 g/liter |
| Temperature: | 30° C. |
| (Electrolytic copper plating solution) | |
| Sulfuric acid: | 180 g/liter |
| Copper sulfate: | 80 g/liter |
| Additive: | CAPARACID GL (by ATOTEK Japan), 1 ml/liter |
| (Plating conditions) | |
| Current density: | 2 A/dm$^2$ |
| Time: | 30 min |
| Temperature: | 25° C. |

Figure 2D:
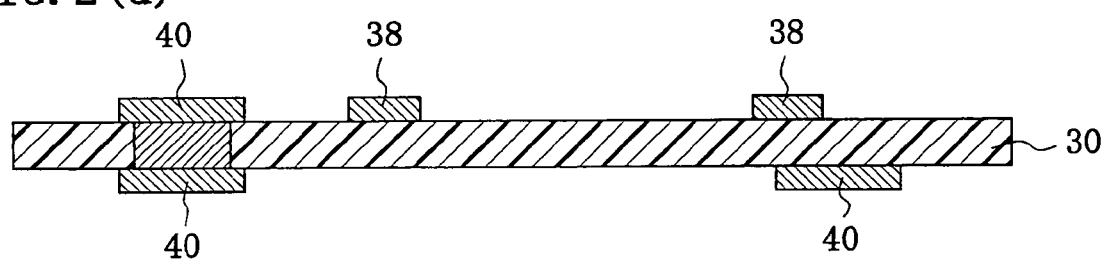

(3) The substrate having the copper plating filled in the opening 34 is etched at both sides with the cupric chloride aqueous-solution to form a wiring pattern 38 on either side of the substrate, and a part of the wiring pattern 38 is formed into an interconnecting electrode pad 40 (as in FIG. 2(d)).

Figure 2E:
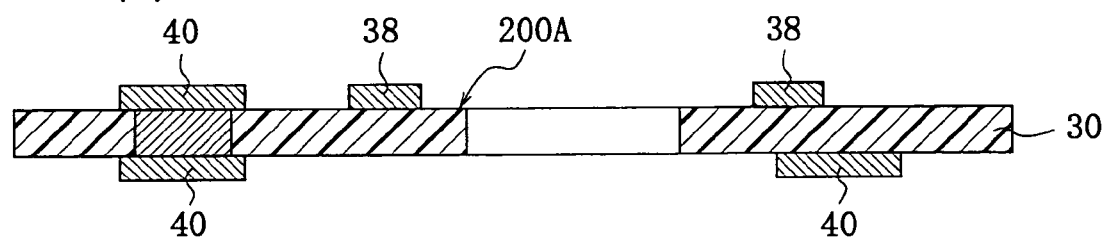

In this case, no coverlay is formed on the surface of the rigid substrate to which the flexible substrate is to be joined. That is, a conductor portion of the rigid-substrate surface including the wiring pattern is exposed. Further, the substrate is routed by a rooter to provide a rigid substrate 200A (as in FIG. 2(e)).

(C) Stacking the Substrates

Figure 3:
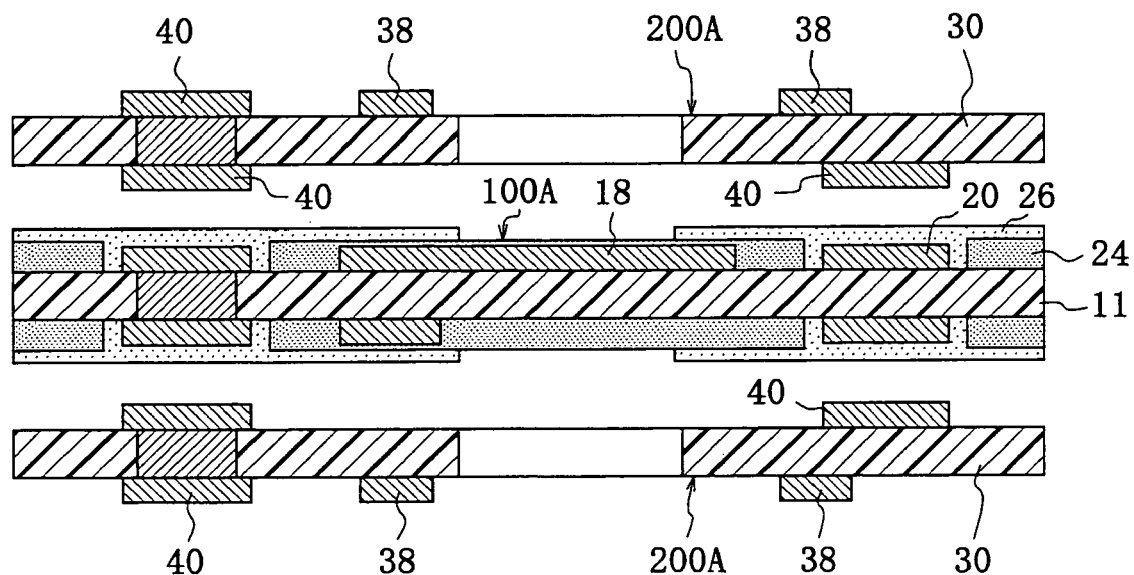
FIG. 3 shows still other steps of the process of producing the flex-rigid wiring board according to example 1 of the present invention.

The rigid substrate 200A prepared in the above process (B) is placed opposite to either side of the flexible substrate 100A prepared in the above process (A) (as in FIG. 3), these substrates 200A and 100A are hot-pressed at 180° C. under a pressure of 40 kg/cm$^2$ to let conductive particles in the anisotropic conductive adhesive layers 26 gather together in areas where the interconnecting electrode pads 20 on the flexible substrate 100A and interconnecting electrode pads 40 on the rigid substrates 200A are opposite to each other.

In this case, the conductive particles will be gathered densely near each interconnecting electrode pad 20 on the flexible substrate 100A while they will be gathered dispersedly on each coverlay 24 and wiring patterns 18.

Figure 4:
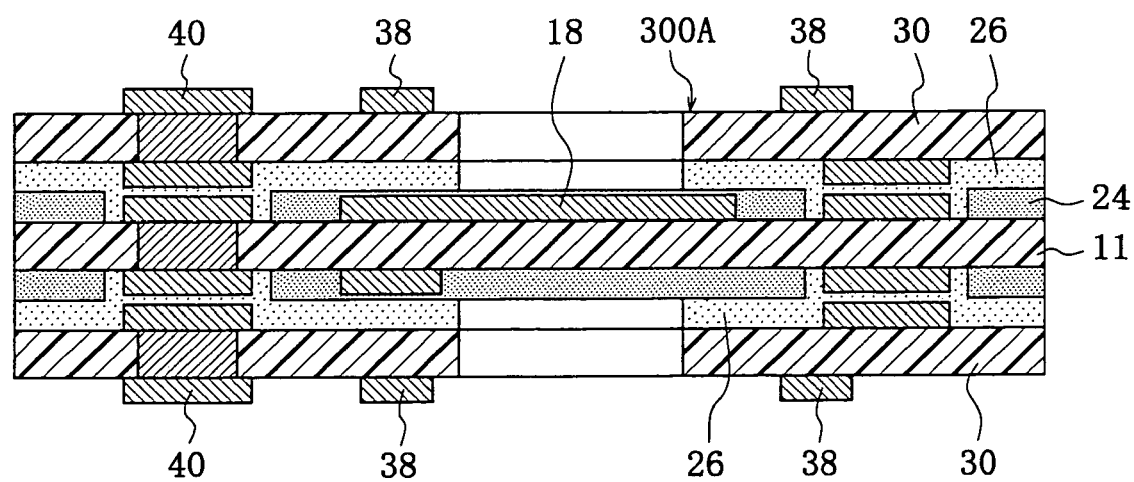
FIG. 4 shows the flex-rigid wiring board according to example 1 of the present invention.

Thus there is provided a flex-rigid wiring board 300A (see FIG. 4) in which the flexible substrate 100A and rigid substrates 200A are electrically connected to each other via the anisotropic conductive adhesive layers 26 interposed between the interconnecting electrode pads 20 and 40 provided on these substrates, respectively, while they are physically joined to each other at portions other than the interconnecting electrode pads.

EXAMPLE 2

A flex-rigid wiring board is produced similarly to the aforementioned example 1 except that each coverlay 24 formed on the flexible substrate 100A is formed to a thickness of 25 μm.

EXAMPLE 3

A flex-rigid wiring board is produced similarly to the example 1 except that each coverlay 24 formed on the flexible substrate 100A is formed to a thickness of 40 μm.

REFERENCE EXAMPLE 1

A flex-rigid wiring board is produced similarly to the example 1 except that each coverlay 24 formed on the flexible substrate 100A is formed to a thickness of 50 μm.

EXAMPLE 4

A flex-rigid wiring board is produced similarly to the example 1 except that no coverlay is formed on the flexible substrate 100A but a coverlay to protect each of the wiring patterns on each rigid substrate 200A except for the interconnecting electrode pads is formed to a thickness of 30 μm.

EXAMPLE 5

A flex-rigid wiring board is produced similarly to the above example 4 except that the coverlay to protect each of the wiring patterns on each rigid substrate 200A except for the interconnecting electrode pads is formed to a thickness of 25 μm.

EXAMPLE 6

A flex-rigid wiring board is produced similarly to the above example 4 except that the coverlay to protect each of the wiring patterns on each rigid substrate 200A except for the interconnecting electrode pads is formed to a thickness of 40 μm.

EXAMPLE 7

A flex-rigid wiring board is produced similarly to the above example 1 except that no coverlay is formed on the flexible substrate 100A and the openings formed correspondingly to the interconnecting electrode pads provided on the flexible substrate 100A are spaced 20 μm from each other.

EXAMPLE 8

A flex-rigid wiring board is produced similarly to the above example 1 except that the openings formed correspondingly to the interconnecting electrode pads provided on the flexible substrate 100A are spaced 300 μm from each other.

EXAMPLE 9

A flex-rigid wiring board is produced similarly to the above example 1 except that the openings formed correspondingly to the interconnecting electrode pads provided on the flexible substrate 100A are spaced 400 μm from each other.

EXAMPLE 10

A flex-rigid wiring board is produced similarly to the above example 1 except that the openings formed correspondingly to the interconnecting electrode pads provided on the flexible substrate 100A are spaced 500 μm from each other.

REFERENCE EXAMPLE 2

A flex-rigid wiring board is produced similarly to the above example 1 except that the openings formed correspondingly to the interconnecting electrode pads provided on the flexible substrate 100A are spaced 10 μm from each other.

REFERENCE EXAMPLE 3

A flex-rigid wiring board is produced similarly to the above example 1 except that the openings formed correspondingly to the interconnecting electrode pads provided on the flexible substrate 100A are spaced 550 μm from each other.

COMPARATIVE EXAMPLE 1

A conventional flex-rigid wiring board, in which rigid substrates and a flexible substrate are joined to each other and wiring pattern layers on the surfaces of the flexible and rigid substrates, respectively, stacked together are electrically connected to each other via a plated through-hole conductive layer at the joints between the flexible and rigid substrates, is produced as in the following steps (1) to (3).

Figure 12:
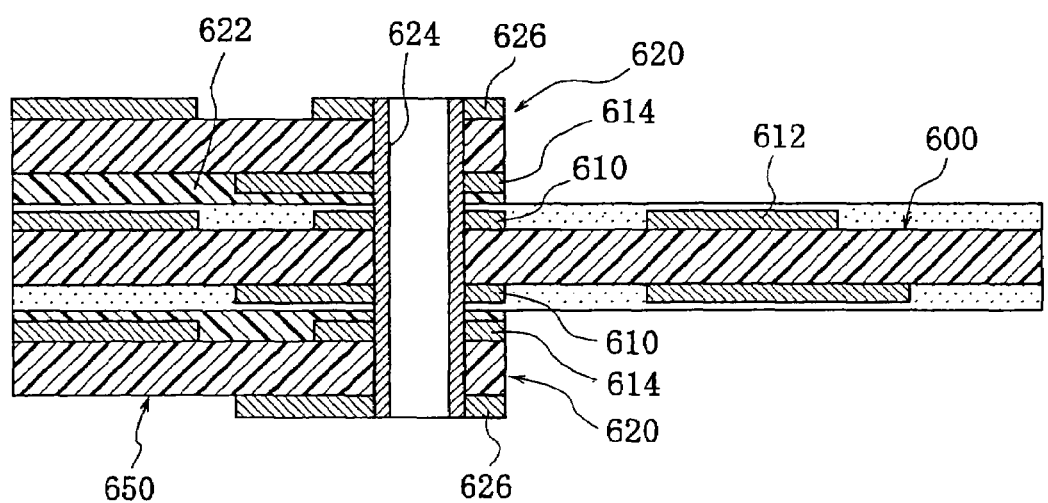
FIG. 12 is a schematic sectional view of a conventional flex-rigid wiring board.

(1) As shown in FIG. 12, an internal-layer circuit 610 and an electrical circuit 612 are formed on a flexible substrate by the subtractive process. Next, a punched coverlay film is positioned and provisionally attached on the conductor circuit. Then the stack of substrates is hot-pressed by a multi-platen method to provide an internal-layer circuit substrate and flexible substrate 600 which will be a flexible portion.

(2) Another inner-layer circuit 614 is formed on one side of a glass epoxy double-sided copper-clad laminate by the subtractive method. Next, the stack of substrates was contoured to provide a rigid substrate 620 that forms one conductive layer of a multilayer rigid portion.

(3) The flexible substrate 600 and a plurality of rigid substrates 620, formed in the above steps (1) and (2), respectively, are stacked and secured together via prepregs 622, and joined to each other by hot-pressing.

Next, by forming holes in the stack of substrates and making electroless plating of the holes, the inner-layer circuit 610 and outer-layer circuit 614 are connected electrically to each other via a plated through-hole 624, and an electrical circuit 626 is formed on the other side of the rigid portion, to thereby complete a flex-rigid wiring board 650.

The flex-rigid wiring boards as in the aforementioned examples 1 to 10, reference examples 1 to 3 and comparative example 1 were tested as follows to evaluate their electrical properties and electrical connection:

(1) Waveform Measurement

Figure 5A:
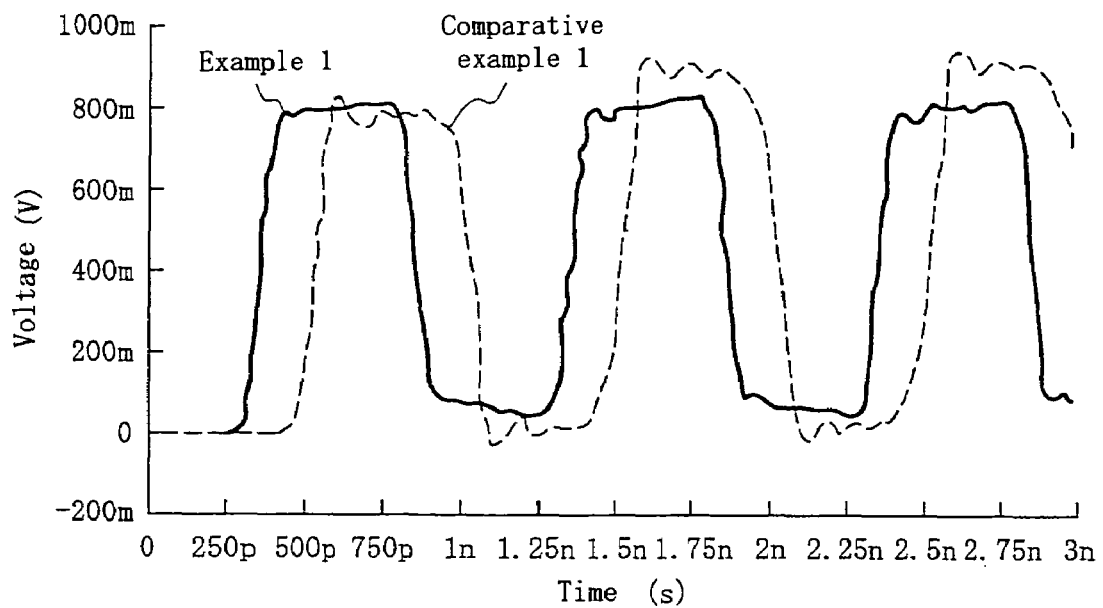
FIG. 5(a) illustrates a pulse voltage waveform (of 1-GHz signal) showing a delay of the signal transmitted between the interconnecting electrode pads.
Figure 5B:
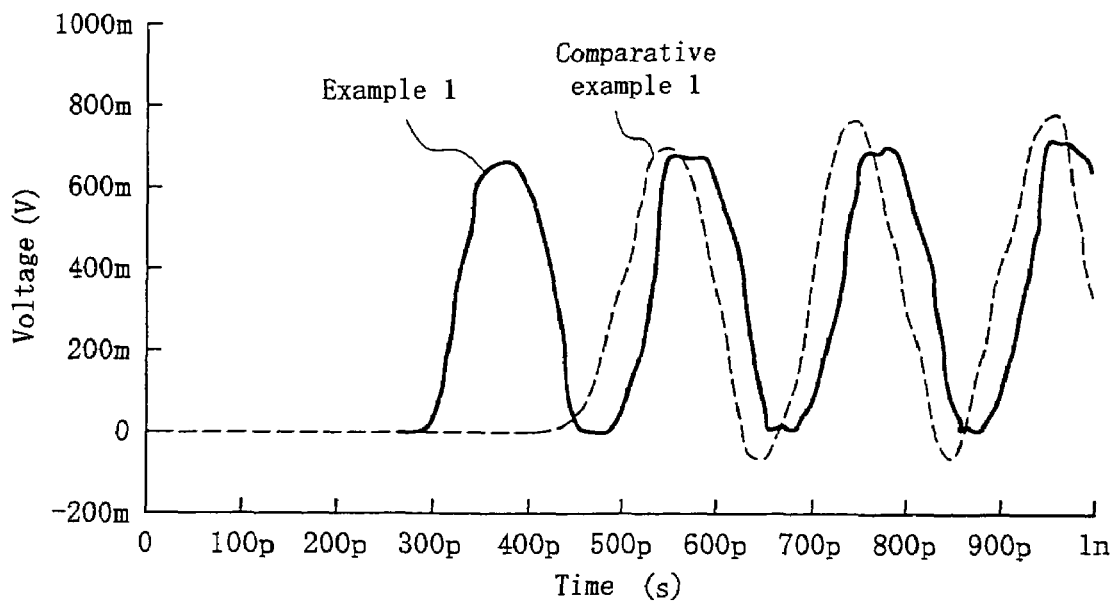
FIG. 5(b) illustrates a pulse voltage waveform (of 5-GHz signal) showing a delay of the signal transmitted between the interconnecting electrode pads.

Using a waveform generator (AWG710 by Tektronics) and digital sampling oscilloscope (11801B by Tektronics) in combination, the example 1 and comparative example 1 were tested for variations in waveform of the pulse voltage between the interconnecting electrode pads. The test results are shown in FIG. 5.

(2) Insulation test 1

The examples 1 to 7, reference example 1 and comparative example 1 were tested for the insulation resistance (initial insulation resistance) at the joints between the flexible and rigid substrates. After that, they were subjected to 1000 cooling/heating cycles in each of which they were left at −65° C. for 3 min and then at 125° C. for 3 min, and then the insulation resistance at the joints between the flexible and rigid substrates was measured. The test results are shown in Table 1.

higher current density in a place nearer to the surface of a conductor. Therefore, in case the substrates are connected to each other via the through-hole or via-hole, the current will flow to both the sides, front and back, of a conductor. However, in case the substrates are connected to each other via the anisotropic conductive adhesive layer, the current will only flow on the surface the layer.

Thus, the current will flow in a reduced amount, and the field strength depending upon the amount of current will also be lower. Therefore, the inductance depending upon the field strength will be lower.

FIG. 5 shows influence of the interference by the reflected wave. As will be known from FIG. 5, the connection between the rigid and flexible substrates via the anisotropic conductive adhesive layer as in the example 1 will result in less distortion

TABLE 1

|  | Thickness of wiring pattern (μm) | Thickness of coverlay (at flexible substrate) (μm) | Thickness of coverlay (at rigid substrate) (μm) | Initial insulation resistance (Ω) | Insulation resistance measured after reliability test (Ω) |
| --- | --- | --- | --- | --- | --- |
| Example 1 | 30 | 30 | — | $10.1 \times 10^{13}$ | $10.9 \times 10^{9}$ |
| Example 2 | 30 | 25 | — | $10.9 \times 10^{13}$ | $11.2 \times 10^{9}$ |
| Example 3 | 30 | 40 | — | $10.4 \times 10^{13}$ | $11.0 \times 10^{9}$ |
| Reference example 1 | 30 | 50 | — | $8.5 \times 10^{13}$ | $9.4 \times 10^{9}$ |
| Example 4 | 30 | — | 30 | $10.5 \times 10^{13}$ | $11.2 \times 10^{9}$ |
| Example 5 | 30 | — | 25 | $10.2 \times 10^{13}$ | $10.3 \times 10^{9}$ |
| Example 6 | 30 | — | 40 | $10.4 \times 10^{13}$ | $10.1 \times 10^{9}$ |
| Example 7 | 30 | — | — | $10.2 \times 10^{13}$ | $10.5 \times 10^{9}$ |
| Comparative example 1 | 30 | — | — | $10.2 \times 10^{11}$ | $10.2 \times 10^{8}$ |

(3) Insulation test 2

The examples 1 and 7 to 10 and reference examples 2 and 3 were tested for the insulation resistance (initial insulation resistance) at the joints between the flexible and rigid substrates. After that, they were subjected to a reliability test (HHTB: 85° C., 85% 50 V applied), and then the insulation resistance at the joints between the flexible and rigid substrates was measured. The test results are shown in Table 2.

TABLE 2

|  | Spacing between adjacent openings (μm) | Initial insulation resistance (Ω) | Insulation resistance after reliability test (Ω) |
| --- | --- | --- | --- |
| Example 1 | 100 | $10.9 \times 10^{13}$ | $10.9 \times 10^{9}$ |
| Example 7 | 20 | $10.2 \times 10^{13}$ | $10.3 \times 10^{9}$ |
| Example 8 | 300 | $10.7 \times 10^{13}$ | $10.5 \times 10^{9}$ |
| Example 9 | 400 | $10.8 \times 10^{13}$ | $10.5 \times 10^{9}$ |
| Example 10 | 500 | $10.1 \times 10^{13}$ | $10.0 \times 10^{9}$ |
| Reference example 2 | 10 | $5.4 \times 10^{12}$ | $2.3 \times 10^{8}$ |
| Reference example 3 | 550 | $7.8 \times 10^{13}$ | $9.4 \times 10^{8}$ |

It will be seen from the above test results that in case the flexible and rigid substrates are connected to each other via the anisotropic conductive adhesive layer as in the present invention, there is less high-frequency noise component than in case the substrates are connected to each other via the plated through-hole.

The following will account for the above. In a higher-frequency band, the skin effect will work more to provide a of the waveform due to the interference by the reflected wave than the connection via the plated through-hole (as in the comparative example 1).

Also, as will be seen from Tables 1 and 2, the initial insulation resistance at the joints between the rigid and flexible substrates in the flex-rigid wiring board as the example of the present invention is on the order of $10 \times 10^{13}$ (Ω), and the insulation resistance measured after the reliability test is about $10 \times 10^{9}$ (Ω), so that a positive conduction, namely, excellent electrical connection, can be assured.

EXAMPLE 11

Figure 6:
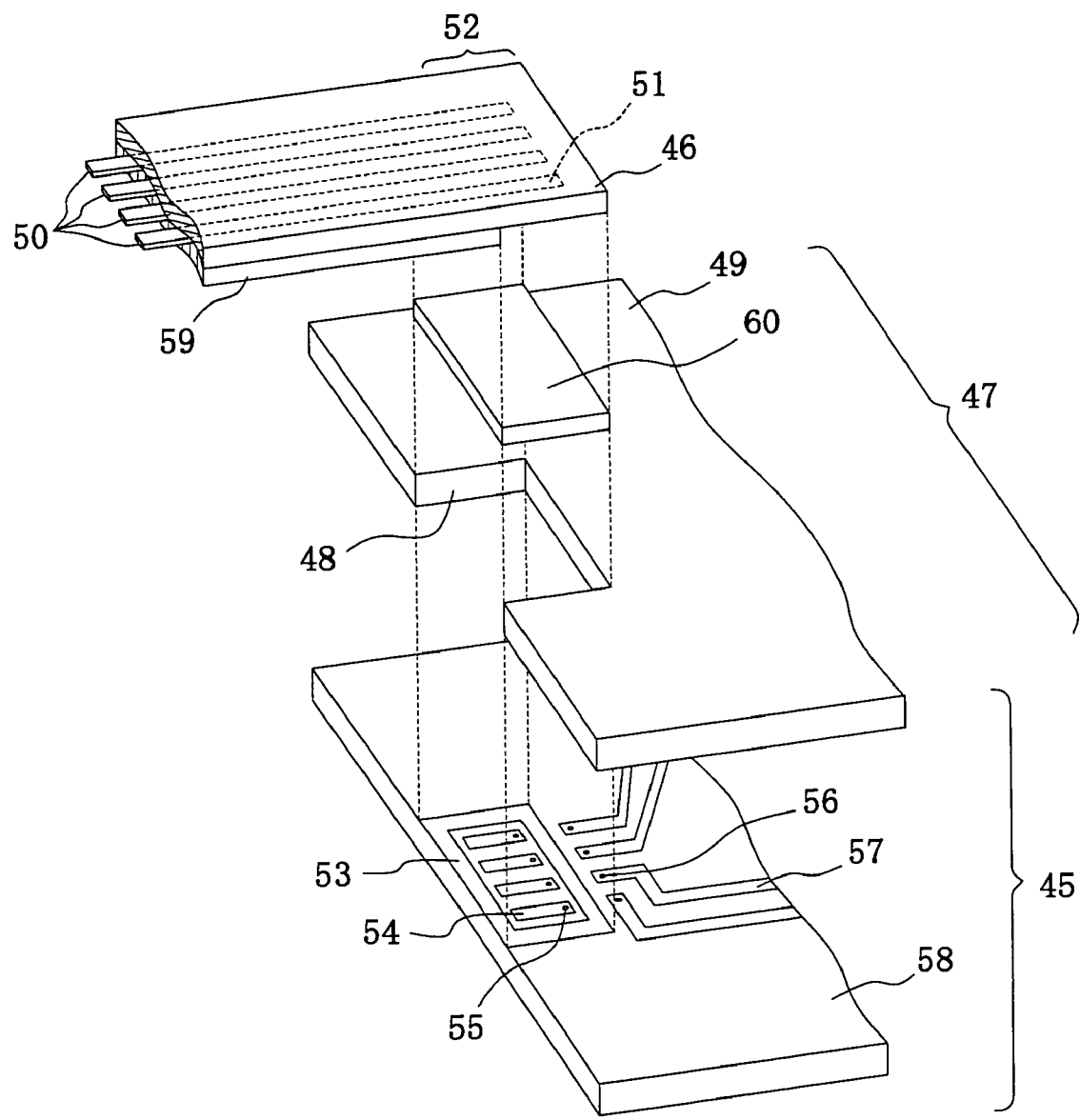
FIG. 6 is an exploded perspective view of a flex-rigid wiring board according to example 11 of the present invention.

FIG. 6 is an exploded perspective view of a flex-rigid wiring board as the example 11 of the present invention.

The flex-rigid wiring board, generally indicated with a reference number 47, includes a second right-substrate layer 58 as a rigid substrate formed from a rigid base material, and a flexible substrate 46 formed from a flexible base material, the second rigid-substrate layer 58 and flexible substrate 46 being joined integrally to each other.

The flexible substrate 46 includes a plurality of first interconnecting pads 51 provided at the end of the substrate 46 and a plurality of first conductor layers 50 connected to the first interconnecting pads 51, respectively.

Also, the second rigid-substrate layer 58 as a rigid substrate includes a frame pattern 53 disposed under the flexible substrate 46 and at the end of the layer 58, a plurality of second interconnecting pads 54 formed in an area surrounded by the frame pattern 53, a plurality of via-contacts 55 formed beneath the second interconnecting pads 54, respectively, and a plurality of second conductor layers 57 connected to the via-contacts 55, respectively.

Between the first conductor layers 50 provided on the flexible substrate 46 and the frame pattern 53 provided on the second rigid-substrate layer 58, there are disposed a coverlay 59 that electrically insulates the frame pattern 53 from the first conductor layers 50 and an anisotropic conductive adhesive layer 60 that compresses the first and second interconnecting pads 51 and 54 together for connecting them to each other.

Note here that the coverlay 59 may be attached or applied to the lower side of the flexible substrate 46. Also, the coverlay 59 may be attached or applied to the surface of the first conductor layers 50 provided on the lower side of the flexible substrate 46 not to cover the first interconnecting pads 51 at the end portion 52 of the flexible substrate 46.

The coverlay 59 may be an adhesive containing polyimide resin as the base, and in case it is to electrically insulate the frame pattern 53 from the first conductor layers 50, it may be patterned to cover the first conductor layers 50 to the boundary of the end portion 52.

Note that th coverlay 59 may also be patterned to extend to the end portion 52 for overlying on the frame pattern 53.

The flexible substrate 46 may be a film-shaped substrate containing polyimide resin as the base. In the example 11, however, the material of the flexible substrate 46 is not limited to the polyimide resin but the flexible substrate 46 may be a glass epoxy substrate of about 50 μm in thickness having a copper-foil layer attached on either side thereof, for example.

Also, the flex-rigid wiring board 47 as the example 11 may be formed by integrally joining a rigid substrate 45 including a plurality of rigid base materials stacked together and the flexible substrate 46 formed from a flexible base material to each other.

More specifically, the rigid substrate 45 in the example 11 of the present invention is formed by stacking the first rigid-substrate layer 49 having a cut 48 formed in the end thereof on the second rigid-substrate layer 58 disposed below the first rigid-substrate layer 49, for example.

The above second rigid-substrate layer 58 includes the frame pattern 53 exposed through the cut 48 in the first rigid-substrate layer 49, the plurality of second interconnecting pads 54 formed in the area surrounded by the frame pattern 53, the plurality of via-contacts 55 provided beneath the second interconnecting pads 54, respectively, and the second conductor layers 57 connected to the via-contacts 55, respectively.

On the other hand, the flexible substrate 46 includes the end portion 52 that is fitted in the cut 48 formed in the first rigid-substrate layer 49, the plurality of first interconnecting pads 51 provided at the end portion 52, and the plurality of first conductor layers 50 connected to the first interconnecting pads 51, respectively.

Further, between the first conductor layers 50 on the flexible substrate 46 and the frame pattern 53 on the second rigid-substrate layer 58, there are disposed the coverlay 59 that electrically insulates the frame pattern 53 from the first conductor layers 50 and the anisotropic conductive adhesive layer 60 that compresses the first and second interconnecting pads 51 and 54 together for connecting them to each other.

Note that the rigid substrate 45 included in the example 11 may be formed from the first and second rigid-substrate layers 49 and 58 formed by patterning a metallic conductor layer on an insulative resin substrate of a rigid base material such as glass fabric epoxy base material, glass bismaleimide triazine base material or the like and stacking them together using an adhesive.

Also, the flexible substrate 46 included in the example 11 includes a flexible plastic substrate, film substrate or the like having the plurality of first conductor layers 50 patterned thereon in parallel with each other and the first interconnecting pads 51 formed on the end portion 52 thereof and that are connected to the first conductor layers 50.

The first rigid-substrate layer 49 has the cut 48 formed at the end thereof using a punching die or dicing saw. Also conductor layers (not shown) provided on the surface of the first rigid-substrate layer 49 are electrically connected via via-contacts (not shown) to the second conductor layers 57 formed on the second rigid-substrate layer 58 that is in contact with the back of the layer 49.

The second rigid-substrate layer 58 has patterned on the surface thereof the plurality of second conductor layers 57, plurality of second interconnecting pads 54 and the frame pattern 53 surrounding the second interconnecting pads 57.

The frame pattern 53 is disposed to be exposed through the cut 48 formed in the first rigid-substrate layer 49, and the insulative coverlay 59 is provided on the frame pattern 53 so that it will be put into contact with the latter. Since the second interconnecting pads 54 are electrically connected to the second conductor layers 57 via the via-contacts 55 formed beneath them and conductor layers (not shown) formed on the back, they are electrically insulated independently of the frame pattern 53.

The via-contacts 55 are formed by filling a metal plating in bores of 60 μm in diameter, for example, formed by laser irradiation. By flattening the top of the metal plating projecting from each of the bores, it is possible to uniformly connect the first interconnecting pads 51 and the tops of the second interconnecting pads 54 to each other.

The second interconnecting pads 54 should preferably be laid about 10 to 125 μm off the edge of the frame pattern 53 adjacent to the second interconnecting pads 54. Also, the second interconnecting pads 54 may be nearly equally spaced from each other in a range of about 10 to 125 μm.

The above second interconnecting pads 54 and first interconnecting pads 51 opposite to them should preferably have a generally same width and inter-pad spacing so that they can be connected uniformly to each other. More specifically, both these first and second interconnecting pads should preferably be formed to have a width of about 125 μm, inter-pad spacing of about 125 μm and length of about 2 mm in more preferred embodiments.

It is preferable that the anisotropic conductive adhesive layer 60 should provisionally be fixed to the surfaces of the second interconnecting pads 54 and frame pattern 53. The conductive adhesive layer 60 should be formed from a material whose melting point (Tg: 171° C., for example) is higher than that of a solder used in mounting electronic parts, a water-absorbing property (0.7%, for example) lower than those of the flexible substrate 46 and second rigid-substrate layer 58, and a low thermal expansivity (48 ppm, for example).

The conductive adhesive layer 60 is called "anisotropic conductive adhesion film (ACF)" and may be "ANISOLM AC-213 by Hitachi Chemical Industry). However, the present invention is not limited to the conductive adhesive layer 60 described herein but may be any other material.

When the flexible substrate 46 and second rigid-substrate layer 58 are joined to each other under compression, the frame pattern 53 uniformises the flow of the conductive adhesive layer 60 thus compressed and prevents the compressed conductive adhesive layer 60 from flowing or swelling out from the cut 48. Thus, the frame pattern 53 is effective for positive electrical connection between the first and second interconnecting pads 51 and 54 via the conductive particles.

Figure 7:
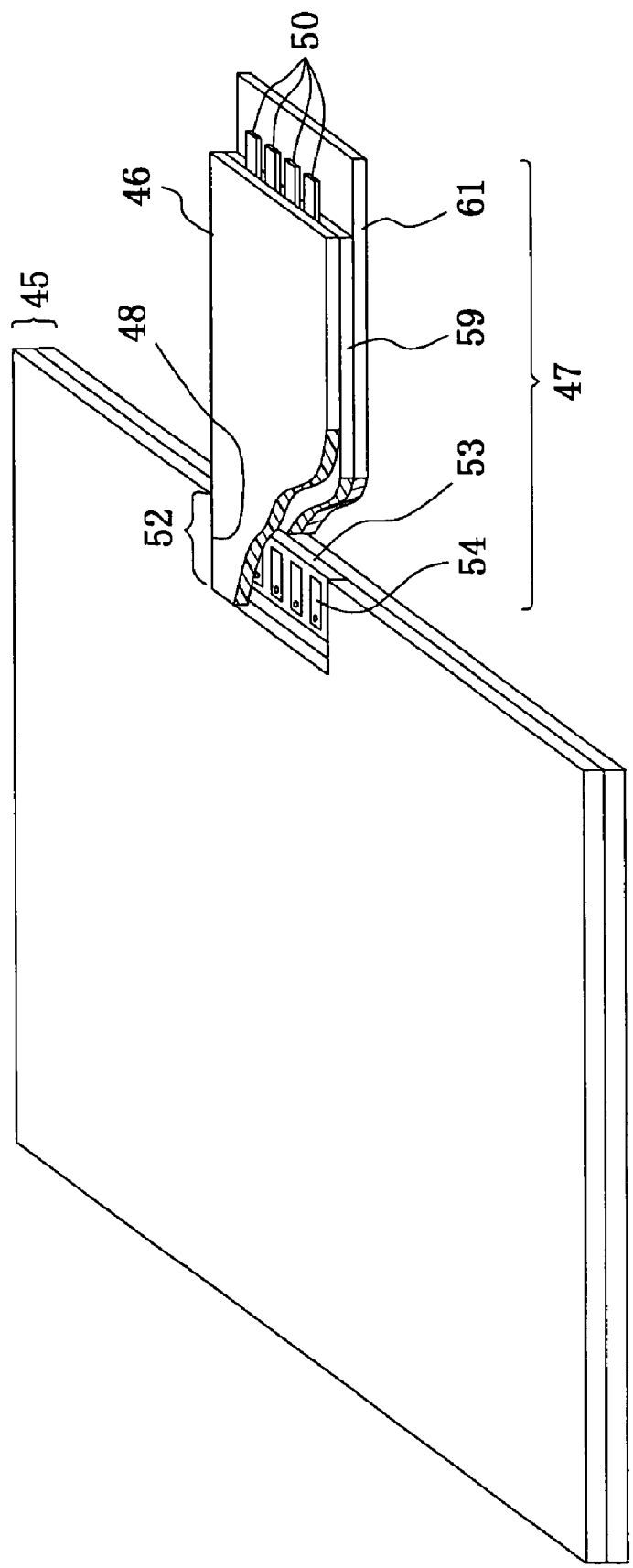
FIG. 7 is a partially fragmentary perspective view of the flex-rigid wiring board shown in FIG. 6.

As shown in the partially fragmentary perspective view in FIG. 7, the flexible substrate 46 in the example 11 is supported on a supporting member 61 disposed on the bottom of the flexible substrate 46 and extending to the boundary of the end portion 52, and has the end portion 52 thereof fitted in the cut 48 formed at the end of the rigid substrate 45.

Since the flexible substrate 46 is bendable, it should preferably be reinforced with the supporting member 61 in the assembling process. The reinforced flexible substrate 46 can easily be assembled, and when assembled in a final product, the supporting member 61 will effectively reduced the stress that will be applied to the end portion 52.

The flexible substrate 46 may have the end portion 52 thereof fitted in the cut 48 with the supporting member 61 being attached to the lower surface of the flexible substrate 46 as shown. Alternatively, the flexible substrate 46 may have the end portion 52 thereof fitted in the cut 48 with the supporting member 61 being attached to the upper surface of the flexible substrate 46 (namely, on the side of the flexible substrate 46 opposite to that shown in FIG. 7).

For example, even in case the upper and lower conductor layers are patterned and connected to each other through filled vias, the flexible substrate 46 may have the end portion 52 thereof fitted in the cut 48 with the supporting member 61 being attached to either the front or back of the flexible substrate 46.

However, the example 11 is not limited to the supporting member 61 having such a length as extending to near the cut 48, described above by way of example. That is, the supporting member 61 may have such a length that it can reinforce the flexible substrate 46 and allows the latter to have the end portion 52 thereof fitted in the cut 48 without being bent. For example, even if the supporting member 61 has such a length that its end extends to a position of a few millimeters to the cut 48, it can allow the flexible substrate 46 to have the end portion 52 thereof fitted into the cut 48 with an improved efficiency.

As shown in FIG. 7, the first conductor layers 50 patterned on the back of the flexible substrate 46 is electrically connected to the second interconnecting pads 54 surrounded by the frame pattern 53 via the first interconnecting pads 51 (as in FIG. 6) and conductive adhesive layer 60 (as in FIG. 6).

Note that if it is known that the frequency of bending the flexible substrate 46 assembled in a final product is low, the supporting member 61 may be removed from after mounting electronic parts on the flex-rigid wiring board 47.

The flex-rigid wiring board 47 as the example 11 can be assembled before mounting electronic parts on the rigid substrate and rigid substrates 45 of different sizes and the flexible substrate 46 can be prepared from separate large-area substrates, both these substrates can be prepared with an improved productivity.

Figure 8:
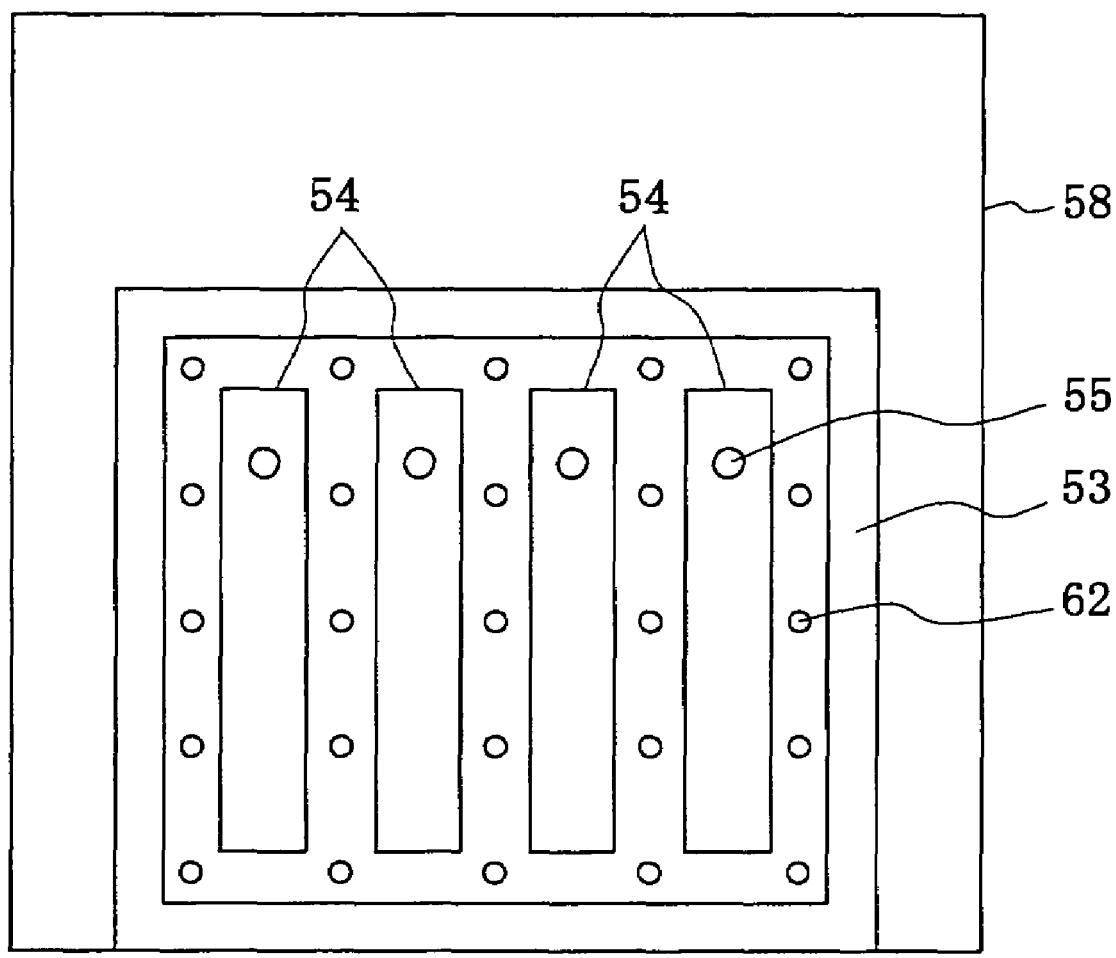
FIG. 8 is a plan view of a second interconnecting pattern on the flex-rigid wiring board shown in FIG. 6.
Figure 9:
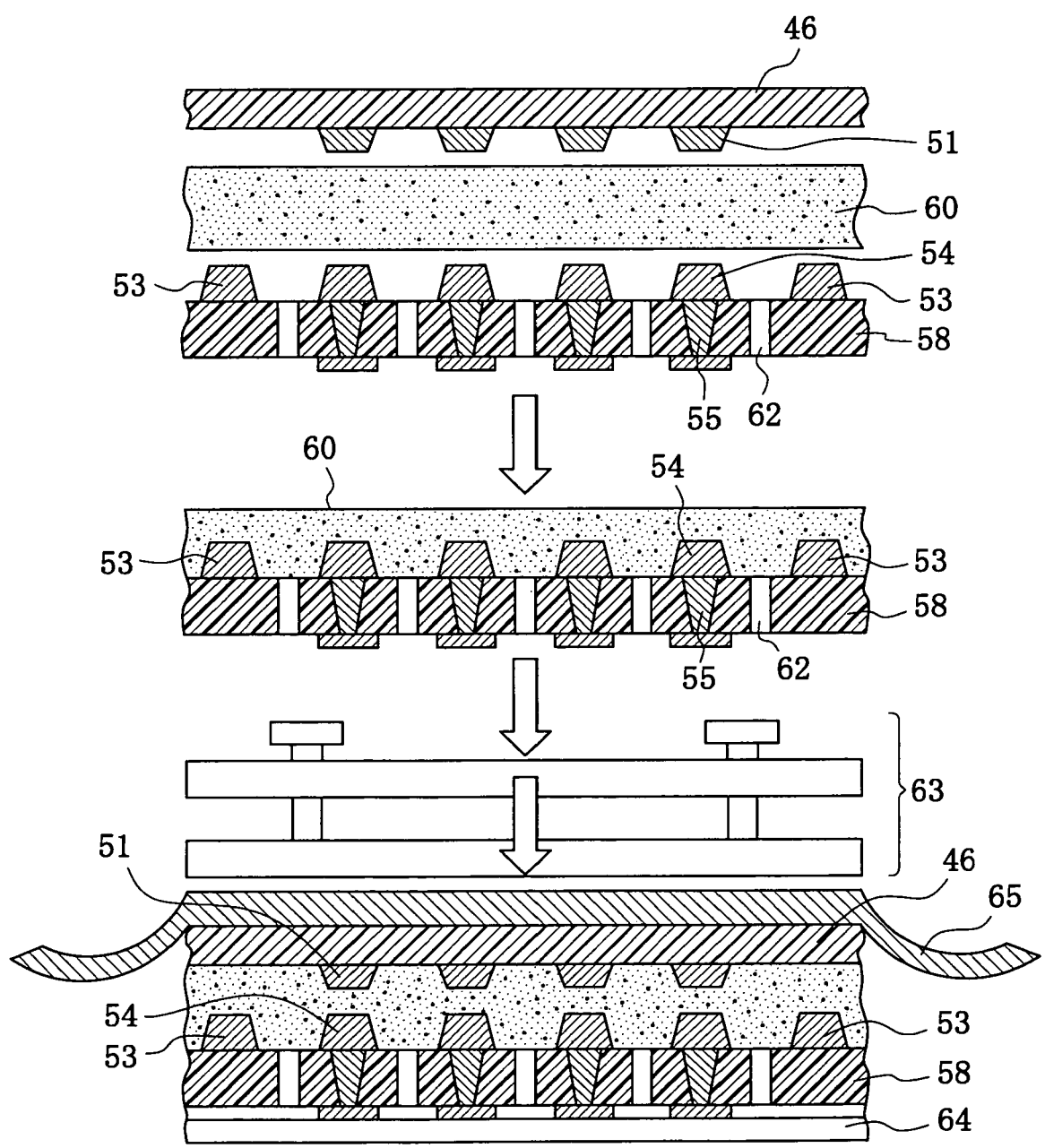
FIG. 9 shows some steps of a process of producing the flex-rigid wiring board shown in FIG. 6.

As shown in FIG. 8, the frame pattern 53 provided on the end portion of the rigid substrate 45 has a rectangular shape. However, the frame pattern 53 included in this example 11 is not limited in shape to such a rectangular one as shown but may be formed to have a circular, elliptical or trapezoidal shape surrounding the plurality of second interconnecting pads 54.

In the second rigid-substrate layer 58, there are formed bore-like stack-up vias, the second interconnecting pads 54 are electrically connected to the second conductor layers 57 separate from the frame pattern 53 via the via-contacts 55 and detouring around the frame pattern 53 (as in FIG. 6).

Each of the second interconnecting pads 54 is patterned to have a rectangular shape. Each of the first interconnecting pads 51 is also patterned to have a rectangular shape so that it is precisely opposite to a corresponding one of the second interconnecting pads 54.

When the flexible substrate 46 and second rigid-substrate layer 58 are joined to each other under compression, the conductive adhesive layer 60 will flow so that its conductive particles will gather together in a local area between the first and second interconnecting pads 51 and 54 while they will be dispersed around both the first and second interconnecting pads. Thus, the first and second interconnecting pads 51 and 54 are electrically connected to each other.

During assembling the flex-rigid wiring board 47, the frame pattern 53 can retain and uniformise the flow of the anisotropic conductive adhesive layer 60 covering the second interconnecting pads 54 in the area surrounded by the frame pattern 53. Thus, a positive electrical connection can be assured between the first and second interconnecting pads.

Note here that in the electrical connection between the interconnecting pads via the ACF (anisotropic conductive adhesive film), the dielectric breakdown of the conductive particles of the ACF layer 60 will be larger due to the field focusing the conductive particles of the ACF layer 60.

On this account, in the example 11, the electrical connection between the first and second interconnecting pads 51 and 54 being assured by the conductive particles held between the tops of the first and second interconnecting pads 51 and 54, the conductive particles are made to flow uniformly to around the first and second interconnecting pads 51 and 54 surrounded by the frame pattern 53, thereby increasing the mean distance between the conductive particles in the insulated area surrounded by the frame pattern 53.

In case the first and second interconnecting pads 51 and 54 are formed with fine pitches, respectively, even if the field intensity near the conductive particles in the edge portions of the interconnecting pads and influenced by the field focusing becomes higher, the insulation of the conductor path including the first and second interconnecting pads 51 and 54 will be rather longer in life than ever because the conductive particles are evenly dispersed.

Therefore, the improvement in electrical properties and insulation life, brought by the electrical connection the by ACF, can be applied to a printed wiring board having a higher-density wiring pattern than ever and to which there is applied a higher voltage than ever.

Further, since the second rigid-substrate layer 58 has a plurality of trough-holes 62 formed in the area thereof surrounded by the frame pattern 53, it is possible to reduce voids occurring in the conductive adhesive layer 60. The through-holes 62 are formed in spaces between the second interconnecting pads 54 and spaces between the second interconnecting pads 54 and frame pattern 53.

Note that in the example 11, the area where the through-holes 62 are formed is no limited to the exposed area, surrounded by the frame pattern 53, of the second rigid-substrate layer 58. The through-holes 62 may be formed in only the spaces between the second interconnecting pads 54 to reduce the voids occurring in the conductive adhesive layer 60 and assure the reliability on the connection between the first and second interconnecting pads.

An example of the method of producing the flex-rigid wiring board as the example 11 of the present invention will be described below with reference to FIGS. 6 to 9.

For producing the flex-rigid wiring board including the second rigid-substrate layer 58 formed by stacking together rigid base materials and the flexible substrate formed from a flexible base material, there is prepared the flexible substrate 46 including the plurality of first interconnecting pads 51 and plurality of first conductor layers 50 connected to the first interconnecting pads 51, respectively, there is prepared the first rigid-substrate layer 49 having the cut 48 formed at the end thereof, and there is prepared the second rigid-substrate layer 58 including the frame pattern 53 formed in a position corresponding to the cut 48 in the first rigid-substrate layer 49 to be exposed through the cut 48, the plurality of second interconnecting pads 54 formed in the area surrounded by the frame pattern 53, the plurality of via-contacts 55 formed beneath the second interconnecting pads 54, respectively, and the second conductor layers 57 connected to the via-contacts 55, respectively.

After the rigid substrate 45 is formed by stacking together the first and second rigid-substrate layers 49 and 58 prepared as above, the coverlay 59 is formed between the first conductor layers 50 on the flexible substrate 46 and the frame pattern 53 on the second rigid-substrate layer 58 to electrically insulate the frame pattern 53 from the first conductor layers 50.

Further, after the anisotropic conductive adhesive layer 60 is interposed between the first interconnecting pads 51 on the flexible substrate 46 and second interconnecting pads 54 on the rigid substrate 45, the end portion of the flexible substrate 46 is fitted in the cut 48 in the rigid substrate 45 to connect the first and second interconnecting pads 51 and 54 to each other via the anisotropic conductive adhesive layer 60 under compression. Thus, the flex-rigid wiring board is produced.

In the above-mentioned process of producing the flex-rigid wiring board as the example 11, the anisotropic conductive adhesive layer 60 interposed between the second rigid-substrate layer 58 and flexible substrate 46 is placed in a range to cover the coverlay 59 and second interconnecting pads 54, and provisionally fixed in close contact with the second rigid-substrate layer 58. In this case, the conductive adhesive layer 60 is also provisionally fixed in close contact with the surfaces of the frame pattern 53 formed on the second rigid-substrate layer 58, coverlay 59 and second interconnecting pads 54 surrounded by the frame pattern 53.

Further, the second rigid-substrate layer 58 placed on a press base 64 and the flexible substrate 46 to be stacked on the second rigid-substrate layer 58 are superposed one on the other, pressed and heated by a press die 63 to join the first and second interconnecting pads 51 and 54 at their tops to each other.

In this case, the first conductor layers 50 are extended from the first interconnecting pads 51 or connected to the latter. However, since the coverlay 59 is disposed in the area where the first conductor layers 50 will be overlaid on the frame pattern 53, the flex-rigid wiring board is advantageous in that the first conductor layers 50 will not electrically be connected to each other.

Also, the flex-rigid wiring board is advantageous in that since the flexible substrate 46 is pressed and heated by the press die 63 via a cushion 65, its area surrounded by the frame pattern 53 will bend so that the first interconnecting pads 51 can be moved toward the second interconnecting pads 54 until the tops of both these interconnecting pads are joined to each other.

Similarly, since the coverlay 59 is laid between the frame pattern 53 and first conductor layers 50, a clearance equivalent to the thickness of the coverlay 59 exists between the first and second interconnecting pads 51 and 54. However, the first and second interconnecting pads 51 and 54 can be moved toward each other and have their tops joined to each other because the flexible substrate 46 is bent.

Figure 10:
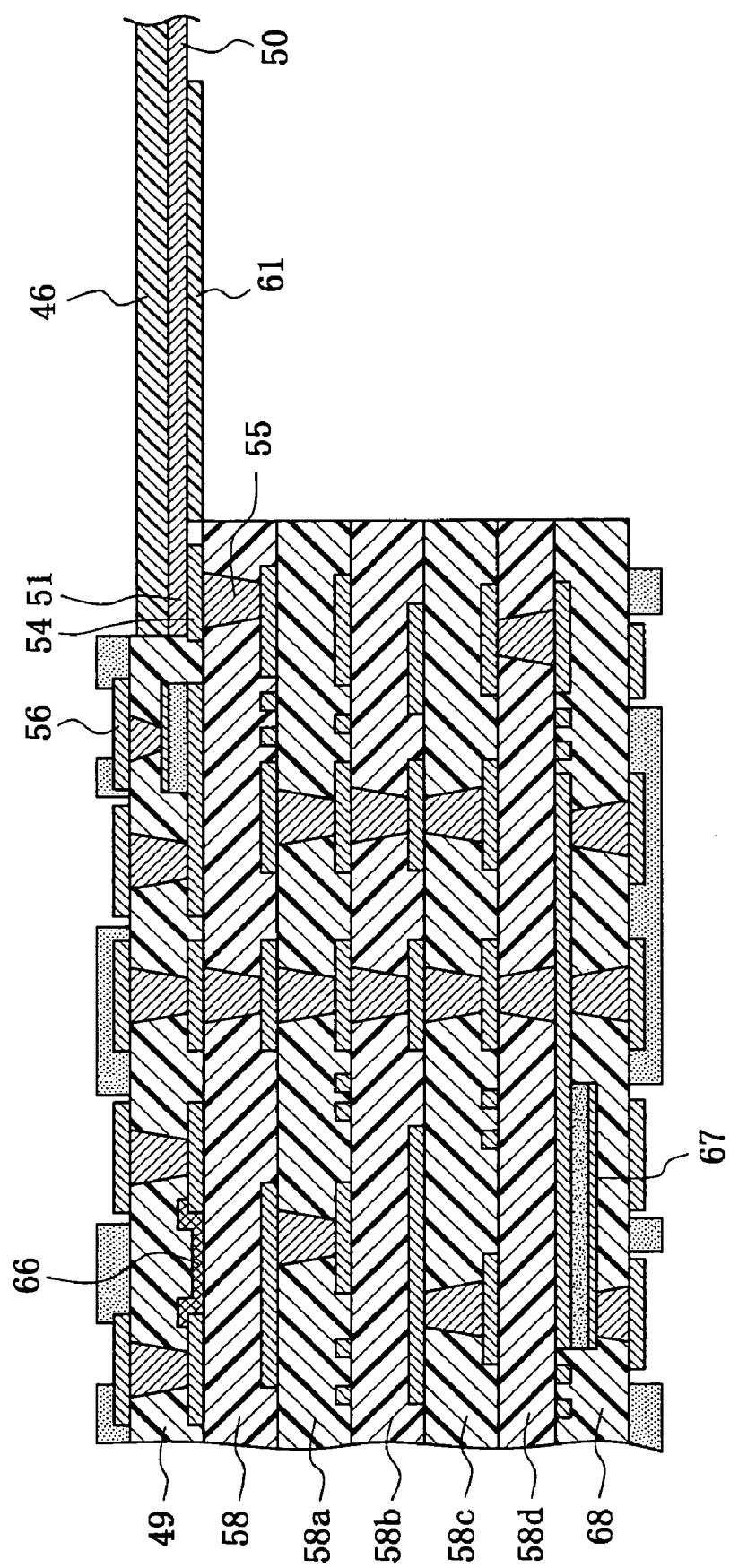
FIG. 10 is a sectional view of a flex-rigid wiring board in which a multilayer rigid substrate and a flexible substrate are joined integrally to each other.

The present invention is not limited to such an example in which the flexible substrate 46 is fitted in the rigid substrate 45 including the stack of the first and second rigid-substrate layers 49 and 58, but it is applicable to a flex-rigid wiring board in which the flexible substrate 46 is fitted in the end portion of a multilayer rigid substrate including the first rigid-substrate layer 58 and lower rigid-substrate layers 58a to 58d each having a copper foil pattern formed on an insulative layer formed from a prepreg as shown in FIG. 10.

In the example 11, a resistive element 66 may be provided inside the first rigid-substrate layer 49 and electrically connected at the terminals thereof to the conductor layer above it via via-contacts as shown in FIG. 10.

Also, a capacitor 67 may be formed by providing a resined copper-foil layer (RCC) 68 on the bottom of the lowest rigid-substrate layers 58d, stacking together the conductor layers formed on the rear side of the lowest rigid-substrate layer 58d and conductor layers inside the resined copper-foil layer 68 with the conductive adhesive layer laid between them.

The flex-rigid wiring board as the example 11 should preferably be formed by stacking the first rigid-substrate layer 49, second rigid-substrate layer 58, lower rigid-substrate layers 58a to 58d and resined copper-foil layer 68, then fitting the flexible substrate 46 in the cut in the first rigid-substrate layer 49 and joining the first and second interconnecting pads 51 and 54 to each other via the conductive adhesive layer by the thermocompression bonding.

Even in case the flexible substrate 46 shown in FIG. 10 is nearly as thick as or thinner than the thickness of the first rigid-substrate layer 49, the first and second interconnecting pads 51 and 54 can positively be connected to each other via a cushion by the thermocompression bonding.

Therefore, the above flex-rigid wiring board can provide a totally thin circuit board on which electronic parts can be mounted with the flexible substrate 46 being not projected over the surface of the circuit board.

Also, since the flexible substrate 46 is fitted in the cut in the first rigid-substrate layer 49, it has the mechanical strength thereof increased against the horizontal and vertical stresses applied when it is bent.

Figure 11:
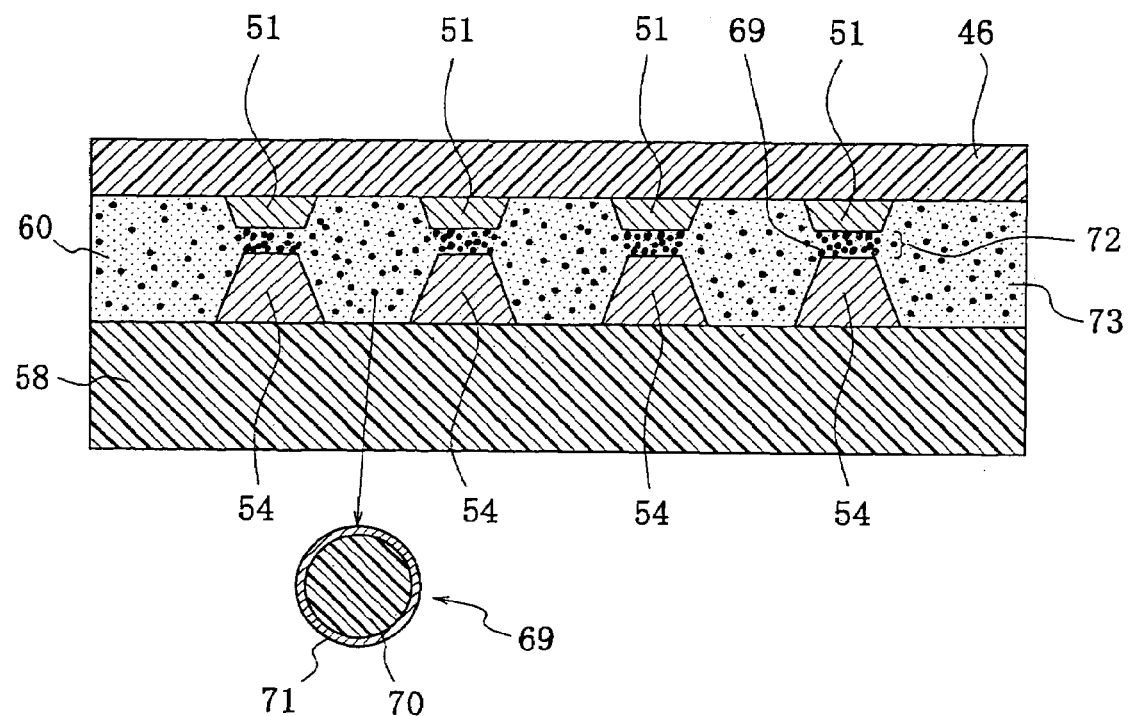
FIG. 11 is a schematic sectional view of a flex-rigid wiring board intended for explanation of the electrical connection between the conductive pads via an anisotropic conductive adhesive.

Moreover, since the first and second interconnecting pads 51 and 54 are electrically connected to each other via the conductive adhesive layer 60 as shown in FIG. 11, the electrical connection between them is more excellent than ever and also the connection reliability can be improved.

Note that a gold-plating layer may be formed on the nickel-plating layer on the surfaces of the first and second interconnecting pads 51 and 54, whereby the conductive particles in the anisotropic conductive adhesive layer can positively be connected electrically to each of the interconnecting pads.

Next, the theory of connection between the interconnecting pads via the anisotropic conductive adhesive layer 60 will be described in detail below with reference to FIG. 11.

The conductive adhesive layer 60 is a gelled or sheet-shaped mixture of an epoxy adhesive and conductive particles 69 as base components.

The conductive particles 69 are generally spherical particles 70 of an elastic material such as nickel or plastic, whose surfaces are gold-plated. The size of the particles 69 is about 2 to 10 μm. The conductive adhesive layer 60 is laid in a junction area 72 between the flexible substrate 46, upper, and second rigid-substrate layer 58, lower, and pressed from above and below by the cushion 65 and press die 63 (as in FIG. 9) while being heated.

Also, when heated and pressed, the conductive adhesive layer 60 flows from the tops of the plurality of first interconnecting pads 51 and plurality of second interconnecting pads 54 to around the interconnecting pads, and a plurality of conductive particles 69 held between the tops of the first and second interconnecting pads 51 and 54 and thus crushed vertically provides a positive electrically connection between the interconnecting pads 51 and 54 in a junction area 72. As will be seen, the conductive particles 69 gather more densely or in contact with each other between the tops of the interconnecting pads 51 and 54 than around the interconnecting pads.

On the other hand, the conductive particles 69 having flowed to around the first and second interconnecting pads 51 and 54 will float in the epoxy adhesive layer and hence will not be in contact with each other to provide an insulation area 73.

Therefore, the conductive adhesive layer 60 can provide an electrical conduction area, namely, a positive electrical connection, between the first and second interconnecting pads 51 and 54 vertically opposite to each other and also an electrical insulation area between the first or second interconnecting pads adjacent to each other.

Also, since the conductive adhesive layer 60 contains the epoxy adhesive, it can be cured at the normal temperature to bond the flexible substrate 46 and second rigid-substrate layer 58 to each other after having flowed. Therefore, the flexible substrate 46 and second rigid-substrate layer 58 can mechanically be joined to each other with an improved strength of bonding.

Further, a plasticizer may be added to the conductive adhesive layer 60 for re-joining between the flexible substrate and second rigid-substrate layer. Namely, the flex-rigid wiring board at the normal temperature may be heated to soften the conductive adhesive layer 60, the flexible substrate 46 be separated from the second rigid-substrate layer 58 and a separate replacement flexible substrate be re-joined to the second rigid-substrate layer 58.

Note that the functions and effects of the examples of the present invention have been described just as examples and the present invention can be embodied to implement functions and effects other than having been described in the foregoing.

INDUSTRIAL APPLICABILITY

As having been described in the foregoing, the present invention provides a thinner flex-rigid wiring board excellent in electrical connection and connection reliability and in which the rigid substrates and flexible substrate are joined to each other via the anisotropic conductive adhesive layer provided between the interconnecting electrode pads provided on the rigid substrate and those provided on the flexible substrate to assure a stable transmission of electric signals while reducing the delay of GHz-level electric signals.

The invention claimed is:

1. A flex-rigid wiring board comprising:
a flexible substrate comprising a flexible base material and a first conductive layer having first interconnecting electrode pads provided on at least one surface of the flexible substrate;
a rigid substrate comprising a rigid base material and a second conductive layer having second interconnecting electrode pads provided on at least one surface of the rigid substrate in a position opposite to the first interconnecting electrode pads on the flexible substrate;
a coverlay interposed between the first and second conductive layers and having a plurality of openings aligned such that each of the first interconnecting electrode pads are exposed to a respective second interconnecting electrode pad through a respective opening formed in the coverlay; and
an anisotropic conductive adhesive layer provided at least within said openings and interposed between opposing first and second interconnecting electrode pads.

2. The flex-rigid wiring board according to claim 1, wherein said coverlay is provided on at least one of the flexible substrate or rigid substrate.

3. The flex-rigid wiring board according to claim 1, wherein the plurality of openings formed in the coverlay are provided adjacent to each other and spaced 20 to 500 μm from each other.

4. The flex-rigid wiring board according to claim 1, wherein the flexible substrate further comprises a via-hole formed from a through-hole extending from a top surface of the flexible substrate to a bottom surface of the flexible substrate and filled with a conductive substance, wherein the first interconnecting electrode pads are provided above the via-hole.

5. A flex-rigid wiring board comprising:
a flexible substrate comprising a flexible base material, a plurality of first interconnecting pads located at an end of the flexible substrate and a plurality of first conductor layers respectively connected to the first interconnecting pads and extending to an opposite end of the flexible substrate;
a rigid substrate disposed adjacent to the flexible substrate and comprising a rigid base material, a frame pattern provided on an end of the rigid substrate and surrounding a plurality of second interconnecting pads a plurality of via-contacts respectively provided in said second interconnecting pads and a plurality of second conductor layers connected to respective via-contacts;
a coverlay provided between the first conductor layers and the frame pattern to electrically insulate the frame pattern from the first conductor layers; and
an anisotropic conductive adhesive layer provided between the first and second interconnecting pads within the frame pattern to form a compression connection between the first and second interconnecting pads.

6. A flexible substrate comprising a flexible base material and a plurality of first conductor layers and first interconnecting pads;
a rigid substrate comprising:
a first rigid-substrate layer having a cut formed at an end thereof, and
a second rigid-substrate layer disposed under the first rigid-substrate layer and including:
a frame pattern formed to be exposed through the cut in the first rigid-substrate layer,
a plurality of second interconnecting pads formed in an area surrounded by the frame pattern,
a plurality of via-contacts formed beneath the second interconnecting pads, respectively, and
a second conductor layer connected to each of the via-contacts;
a coverlay provided between the first conductor layers and the frame pattern to electrically insulate the frame pattern from the first conductor layers; and
an anisotropic conductive adhesive layer provided between the first and second interconnecting pads within the frame pattern to provide a compression connection between the first and second interconnecting pads.

7. The flex-rigid wiring board according to claim 6, wherein the first and second interconnecting pads are substantially equal in width to each other and clearances between adjacent interconnecting pads are substantially identical to each other.

8. The flex-rigid wiring board according to claim 6, further comprising a plurality of through-holes is formed in the area surrounded by the frame pattern provided on the second rigid-substrate layer.

9. The flex-rigid wiring board according to claim 6, further comprising a plated nickel/gold layer is formed on the surface of each of the first and second interconnecting pads.

10. A method of producing a flex-rigid wiring board in which a rigid substrate formed from a stack of rigid base materials and a flexible substrate formed from a flexible base material are joined to each other, the method comprising the steps of:

preparing a flexible substrate including a plurality of first interconnecting pads and a plurality of first conductor layers connected to the first interconnecting pads, respectively;

preparing a first rigid-substrate layer having a cut formed at either end thereof while preparing a second rigid-substrate layer including a frame pattern exposed from the cuts, a plurality of second interconnecting pads formed in an area surrounded by the frame pattern, a plurality of via-contacts formed beneath the second interconnecting pads, respectively, and a second conductor layer connected to each of the via-contacts;

stacking the first and second rigid-substrate layers together to form a rigid substrate;

forming a coverlay between the first conductor layers of the flexible substrate and the frame pattern of the second rigid-substrate layer to electrically insulate the frame pattern from the first conductor layers;

forming an anisotropic conductive adhesive layer between the first interconnecting pads of the flexible substrate and second interconnecting pads of the rigid substrate; and fitting the free end of the flexible substrate into the cut in the rigid substrate to provide a compression connection between the first and second interconnecting pads via the anisotropic conductive adhesive layer.

\* \* \* \* \*